United States Patent
Jacobs et al.

(10) Patent No.: US 8,853,956 B2
(45) Date of Patent: Oct. 7, 2014

(54) ORGANIC LIGHT EMITTING DIODE DRIVER ARRANGEMENT

(75) Inventors: Joseph Hendrik Anna Maria Jacobs, Eygelshoven (NL); Dirk Hente, Wuerselen (DE)

(73) Assignee: Koninklijke Philips N.V., Eindhoven (NL)

( * ) Notice: Subject to any disclaimer, the term of this patent is extended or adjusted under 35 U.S.C. 154(b) by 736 days.

(21) Appl. No.: 12/996,672

(22) PCT Filed: Jun. 19, 2009

(86) PCT No.: PCT/IB2009/052632
§ 371 (c)(1),
(2), (4) Date: Dec. 7, 2010

(87) PCT Pub. No.: WO2009/156925
PCT Pub. Date: Dec. 30, 2009

(65) Prior Publication Data
US 2011/0089862 A1 Apr. 21, 2011

(30) Foreign Application Priority Data

Jun. 25, 2008 (EP) .................................. 08104536

(51) Int. Cl.
*H05B 41/36* (2006.01)

(52) U.S. Cl.
USPC ..................... 315/209 R; 315/224; 315/291

(58) Field of Classification Search
CPC .. H05B 37/02; H05B 33/0815; H05B 33/083; H05B 33/0845; H05B 41/16; H05B 33/08; H05B 33/0806; H05B 33/0812; H05B 33/0836; H05B 33/0842; H05B 33/0851; H05B 41/04; F21V 23/04; G03G 15/04054
USPC ............. 315/86, 88, 93, 119, 121, 122, 123, 315/125, 127, 128, 185 R, 186, 192, 193, 315/185 S, 209 R, 210, 217, 224, 225, 226, 315/291, 294, 295, 297, 299, 307, 312, 313, 315/320, 362
See application file for complete search history.

(56) References Cited

U.S. PATENT DOCUMENTS

| | | | |
|---|---|---|---|
| 5,757,139 | A | 5/1998 | Forrest et al. |
| 7,173,369 | B2 * | 2/2007 | Forrest et al. ................ 313/503 |

(Continued)

FOREIGN PATENT DOCUMENTS

| | | |
|---|---|---|
| WO | 2005104072 A1 | 11/2005 |
| WO | 2007069124 A1 | 6/2007 |
| WO | WO 2007069124 A1 * | 6/2007 ............. H05B 33/08 |

OTHER PUBLICATIONS

Mohan et al: "Power Electronics-Converters, Applications and Design"; John Wiley and Sons, 1995, Chapter 7, pp. 164-172.

(Continued)

*Primary Examiner* — Douglas W Owens
*Assistant Examiner* — Jianzi Chen
(74) *Attorney, Agent, or Firm* — Yuliya Mathis

(57) ABSTRACT

Driver arrangements (100) drive first organic light emitting diode circuits (1) coupled to reference terminals (10) and first output terminals (11) and drive second organic light emitting diode circuits (2) coupled to the first output terminals (11) and to second output terminals (12). The driver arrangements (100) comprise first/second elements (21/22) coupled to the first/second output terminals (11) and the reference terminals (10) and first/second switches (31/32) coupled to power source terminals (14) and the first/second output terminals (11/12) for controlling the stacked organic light emitting diode circuits (1, 2) individually. The switches (31, 32) and the first elements (21) comprise transistors and the second elements (22) comprise transistors or diodes. The first/second elements (21/22) and the first/second switches (31/32) are coupled to each other and via first/second inductors (41/42) to the first/second output terminals (11/12).

17 Claims, 25 Drawing Sheets

(56) References Cited

U.S. PATENT DOCUMENTS

| | | | |
|---|---|---|---|
| 7,468,723 B1 * | 12/2008 | Collins | 345/102 |
| 2002/0004759 A1 | 1/2002 | Bradford et al. | |
| 2005/0019009 A1 | 1/2005 | Gough | |
| 2005/0190094 A1 * | 9/2005 | Andersen | 341/157 |
| 2006/0214596 A1 | 9/2006 | Miller et al. | |
| 2007/0262724 A1 | 11/2007 | Mednik et al. | |
| 2008/0002102 A1 | 1/2008 | Lee | |

OTHER PUBLICATIONS

Jacobs et al: "Drivers for OLEDs"; IEEE IAS 2007, 6 Page Document.

* cited by examiner

ORGANIC LIGHT EMITTING DIODE DRIVER ARRANGEMENT

FIELD OF THE INVENTION

The invention relates to a driver arrangement for driving first and second organic light emitting diode circuits, to a device comprising a driver arrangement, and to a method.

Examples of such a driver arrangement are driver arrangements for driving stacked organic light emitting diode circuits.

BACKGROUND OF THE INVENTION

U.S. Pat. No. 5,757,139 discloses a driving circuit for stacked organic light emitting devices. Each organic light emitting device has its own voltage source.

SUMMARY OF THE INVENTION

It is an object of the invention to provide a driver arrangement for driving first and second organic light emitting diode circuits that do not need to have their own voltage source.

Further objects of the invention are to provide a device and a method that do not require that each organic light emitting diode circuit has its own voltage source.

According to a first aspect of the invention, a driver arrangement for driving first and second organic light emitting diode circuits is defined by the driver arrangement comprising a reference terminal and a power source terminal and first and second output terminals, the first organic light emitting diode circuit comprising a first side to be coupled to the reference terminal and a second side to be coupled to the first output terminal, the second organic light emitting diode circuit comprising a first side to be coupled to the first output terminal and a second side to be coupled to the second output terminal, and the driver arrangement comprising a first element coupled to the first output terminal and the reference terminal and a first switch coupled to the power source terminal and the first output terminal and a second element coupled to the second output terminal and the reference terminal and a second switch coupled to the power source terminal and the second output terminal.

By having introduced an element and a switch per output terminal, two stacked organic light emitting diode circuits can be controlled individually via one power source coupled to a power source terminal and a reference terminal.

An organic light emitting diode circuit comprises one or more organic light emitting diodes. A first unit and a second unit are coupled to each other when they are directly connected and when they are indirectly connected via a third unit. The power source terminal is to be coupled to any kind of power source.

According to an embodiment, a driver arrangement is defined by the switches comprising transistors and one of the elements comprising a transistor and the other element comprising a transistor or a diode. So, for controlling two organic light emitting diode circuits, either four transistors are to be used or three transistors and a diode are to be used. Instead of transistors, other switches may be used, and a diode may be realized by using a part of a transistor.

According to an embodiment, a driver arrangement is defined by each transistor comprising an internal anti-parallel diode or being coupled to an external anti-parallel diode. Such anti-parallel diodes may conduct currents in reverse directions.

According to an embodiment, a driver arrangement is defined by the first element and the first switch being coupled to each other and via a first inductor to the first output terminal, and the second element and the second switch being coupled to each other and via a second inductor to the second output terminal. Such inductors reduce ripples in currents. Alternatively, the inductors may form part of the stacked organic light emitting diodes.

According to an embodiment, a driver arrangement for further driving a third organic light emitting diode circuit is defined by the driver arrangement further comprising a third output terminal, the third organic light emitting diode circuit comprising a first side to be coupled to the second output terminal and a second side to be coupled to the third output terminal, and the driver arrangement further comprising a third element coupled to the third output terminal and the reference terminal and a third switch coupled to the power source terminal and the third output terminal. More than three stacked organic light emitting diode circuits are not to be excluded.

According to an embodiment, a driver arrangement is defined by the switches comprising transistors and two of the elements comprising transistors and the other element comprising a transistor or a diode, each transistor comprising an internal anti-parallel diode or being coupled to an external anti-parallel diode, the first element and the first switch being coupled to each other and via a first inductor to the first output terminal, the second element and the second switch being coupled to each other and via a second inductor to the second output terminal, and the third element and the third switch being coupled to each other and via a third inductor to the third output terminal.

According to an embodiment, a driver arrangement is defined by further comprising a controller for controlling the switches and at least one element. The at least one element that is to be controlled is for example a transistor.

According to an embodiment, a driver arrangement is defined by each output terminal and its element and switch forming a stage, each stage being in one out of three modes defining a current passing this output terminal in dependence of said controlling.

According to an embodiment, a driver arrangement is defined by the three modes comprising a continuous conduction mode, a critical/boundary conduction mode and a discontinuous conduction mode. Compared to the continuous conduction mode, the critical/boundary conduction mode has an improved efficiency. The critical/boundary conduction mode and the discontinuous conduction mode allow zero voltage switching. In the discontinuous conduction mode, a current through an inductor can become zero for a short period of time, and a ripple in a current can be minimized.

According to an embodiment, a driver arrangement is defined by said controlling defining a duty cycle and/or a delay and/or a duration of a pulse signal to be supplied to a control electrode of one or more of said switches and element, and/or said controlling comprising synchronous switching.

According to an embodiment, a driver arrangement is defined by the controller comprising a setting circuit for setting a delay of a pulse signal to be supplied to a control electrode of one or more of said switches and element in response to a comparison of reference currents defined for the organic light emitting diode circuits. These reference currents are to be chosen before.

According to a second aspect of the invention, a device is defined by comprising the driver arrangement according to the invention and further comprising the first and second organic light emitting diode circuits.

According to an embodiment, a device is defined by the first and second organic light emitting diode circuits being coupled to each other in a stacked construction. Such a stacked construction comprises for example a transparent electrode between a pair of organic light emitting diode circuits for serially connecting these organic light emitting diode circuits and comprises for example two further electrodes at the ends of the serial connection. In case of three (four or more) organic light emitting diode circuits being coupled to each other in a stacked construction, two (three or more) transparent electrodes and two further electrodes will be present etc.

According to an embodiment, a device is defined by each organic light emitting diode circuit providing blue, green, red or yellow light.

According to a third aspect of the invention, a method for driving first and second organic light emitting diode circuits via a driver arrangement comprising a reference terminal and a power source terminal and first and second output terminals, the first organic light emitting diode circuit comprising a first side to be coupled to the reference terminal and a second side to be coupled to the first output terminal, the second organic light emitting diode circuit comprising a first side to be coupled to the first output terminal and a second side to be coupled to the second output terminal, is defined by the method comprising the steps of coupling the first output terminal and the reference terminal via a first element and switching a coupling between the power source terminal and the first output terminal via a first switch and coupling the second output terminal and the reference terminal via a second element and switching a coupling between the power source terminal and the second output terminal via a second switch.

Embodiments of the device and of the method correspond with the embodiments of the driver arrangement.

An insight might be that a separate voltage source per organic light emitting device is to be avoided.

A basic idea might be that the driver arrangement is to be provided with elements located in parallel to the organic light emitting diode circuits and with switches located serially between the organic light emitting diode circuits and the power source.

A problem to provide a driver arrangement for driving first and second organic light emitting diode circuits that do not need to have their own voltage source is solved.

An advantage might be that organic light emitting diode circuits can be current controlled via the switches and the elements.

These and other aspects of the invention are apparent from and will be elucidated with reference to the embodiment(s) described hereinafter.

DETAILED DESCRIPTION OF EMBODIMENTS

Figure 1:
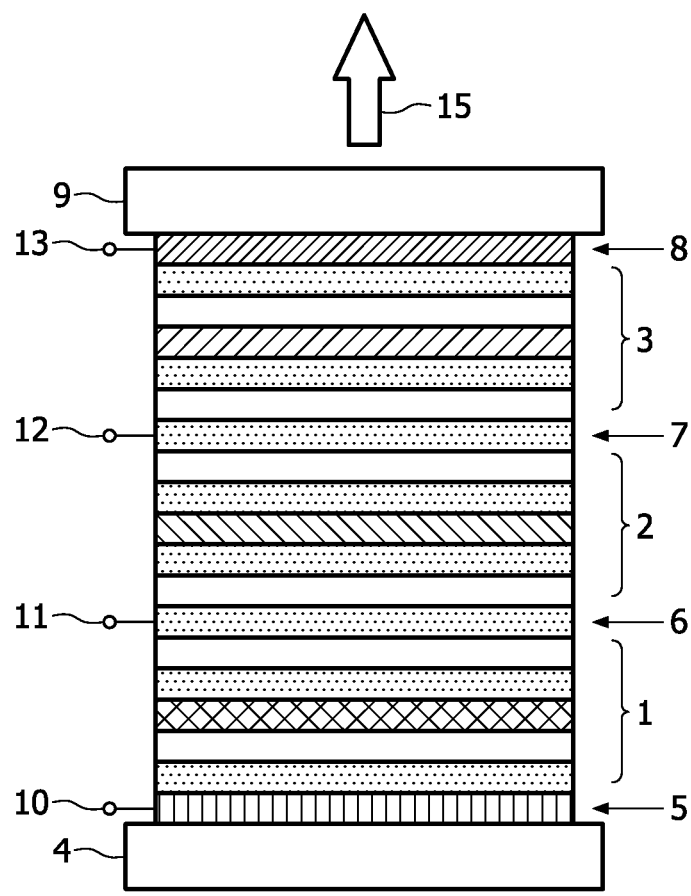
FIG. 1 shows stacked organic light emitting diode circuits.

In the FIG. 1, three stacked organic light emitting diode circuits 1-3 are shown. From the bottom going up, a first glass layer 4, an aluminium layer 5 coupled to a reference terminal 10, a first organic light emitting diode circuit 1 (for generating blue light), a first transparent layer 6 coupled to a first output terminal 11, a second organic light emitting diode circuit 2 (for generating green light), a second transparent layer 7 coupled to a second output terminal 12, a third organic light emitting diode circuit 3 (for generating red light), an indium tin oxide electrode 8 coupled to a third output terminal 13, and a second glass layer 9 are shown. Via the second glass layer 9, light 15 comes out. An example of a transparent layer is a transparent charge generation layer. Other kinds of transparent layers and other kinds of stacked constructions are however not to be excluded.

Figure 2:
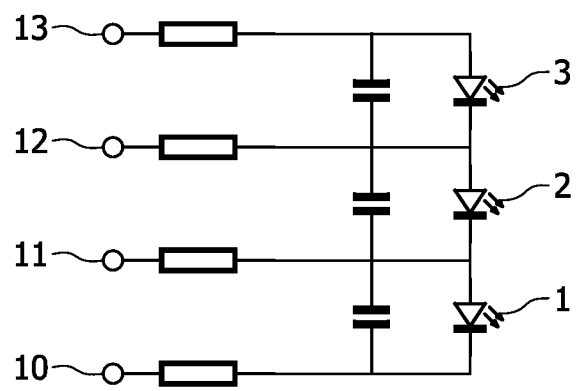
FIG. 2 shows an electric equivalence of the circuits of FIG. 1.

In the FIG. 2, an electric equivalence of the circuits of FIG. 1 is shown. The first organic light emitting diode circuit 1 (for generating blue light) has a first parallel capacitance and its cathode is coupled via a cathode resistance to the reference terminal 10, the second organic light emitting diode circuit 2 (for generating green light) has a second parallel capacitance and its cathode is coupled via a first charge generation layer resistance to the first output terminal 11 and is coupled to the anode of the first organic light emitting diode circuit 1, the third organic light emitting diode circuit 3 (for generating red light) has a third parallel capacitance and its cathode is coupled via a second charge generation layer resistance to the second output terminal 12 and is coupled to the anode of the second organic light emitting diode circuit 2, and the anode of the third organic light emitting diode circuit 3 is coupled to the third output terminal 13.

Figure 3:
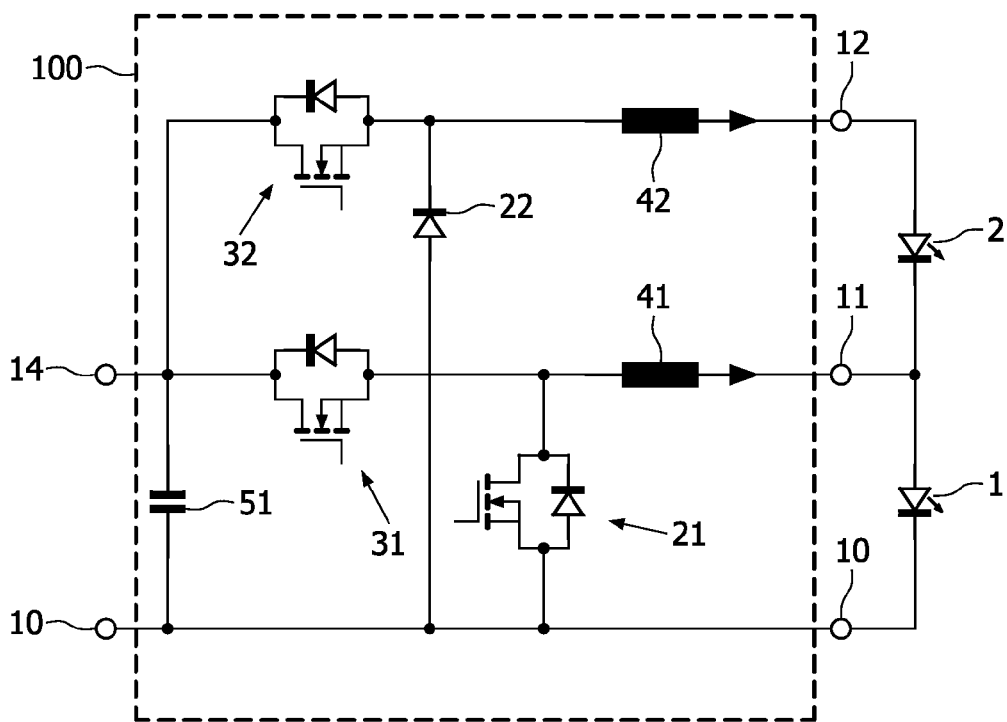
FIG. 3 shows a first embodiment of a driver arrangement.

In the FIG. 3, a first embodiment of a driver arrangement 100 is shown. The driver arrangement 100 for driving the first and second organic light emitting diode circuits 1, 2 comprises the reference terminal 10 and the power source terminal 14 and the first and second output terminals 11, 12. Between the reference terminal 10 and the power source terminal 14, an input capacitor 51 is present. Of the first organic light emitting diode circuit 1, a first side is coupled to the reference terminal 10 and a second side is coupled to the first output terminal 11. Of the second organic light emitting diode circuit 2, a first side is coupled to the first output terminal 11 and a second side is coupled to the second output terminal 12. The driver arrangement 100 comprises a first element 21 coupled to the first output terminal 11 and the reference terminal 10 and comprises a first switch 31 coupled to the power source terminal 14 and the first output terminal 11 and comprises a second element 22 coupled to the second output terminal 12 and the reference terminal 10 and comprises a second switch 32 coupled to the power source terminal 14 and the second output terminal 12. The first and second switches 31, 32 each comprise a transistor and the first element 21 comprises a transistor and the second element 22 comprises a diode, alternatively the second element 22 may comprise a transistor as well.

Preferably, each transistor comprises an internal anti-parallel diode or is coupled to an external anti-parallel diode. Further preferably, the first element 21 and the first switch 31 are coupled to each other and their mutual electrode is coupled via a first inductor 41 to the first output terminal 11, and the second element 22 and the second switch 32 are coupled to each other and their mutual electrode is coupled via a second inductor 42 to the second output terminal 12.

Figure 4:
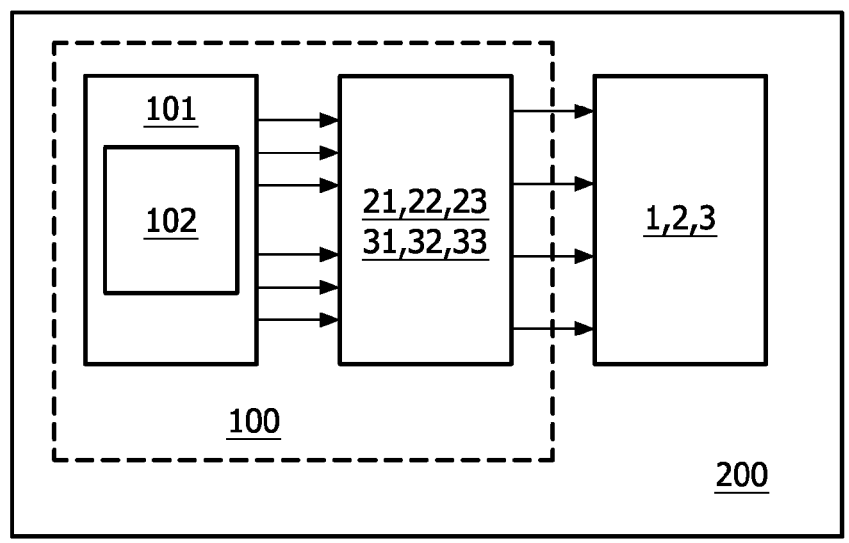
FIG. 4 shows an embodiment of a device.

In the FIG. 4, an embodiment of a device 200 is shown. The device 200 comprises the driver arrangement 100 comprising a controller 101 with a setting circuit 102 and coupled to the switches 31-33 and elements 21-23 and further comprises the organic light emitting diode circuits 1-3 (see also the FIGS. 5 and 6).

Figure 5:
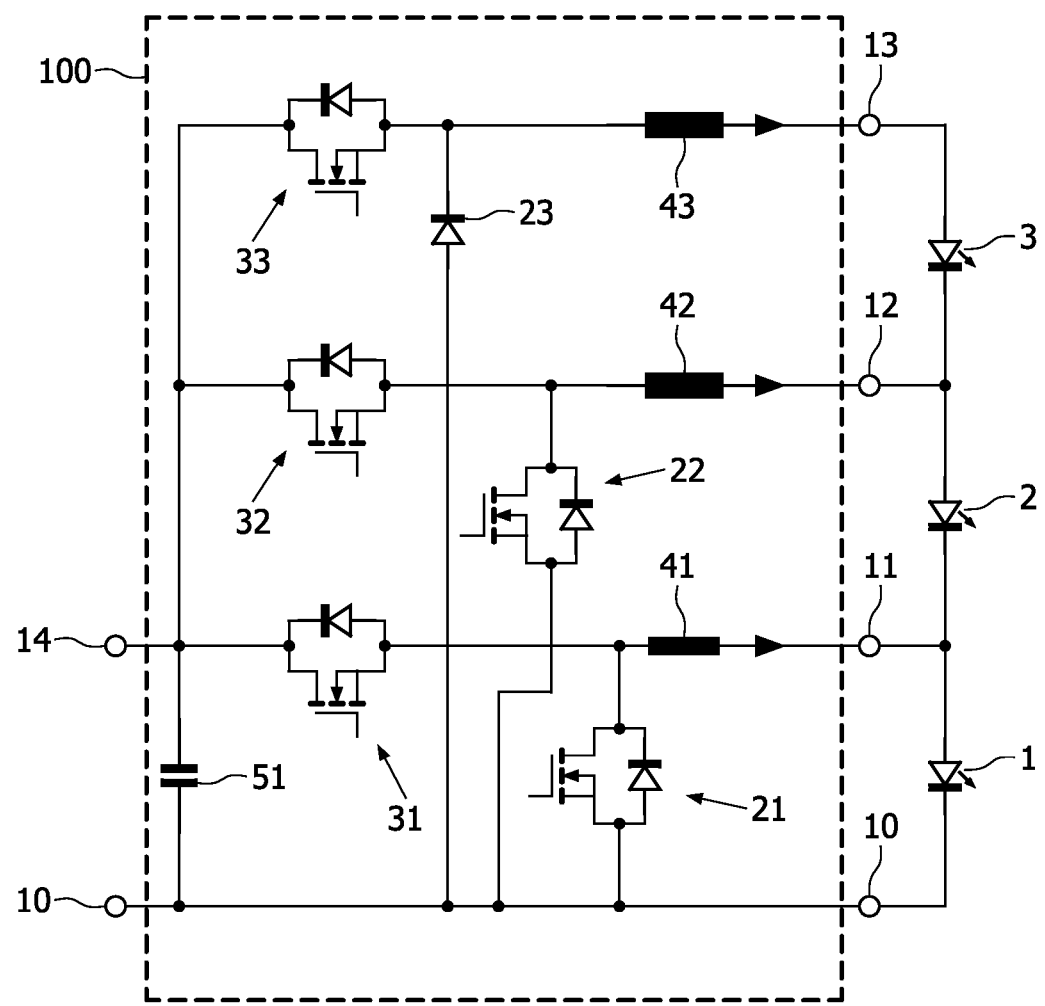
FIG. 5 shows a second embodiment of a driver arrangement.

In the FIG. 5, a second embodiment of a driver arrangement 100 is shown. This driver arrangement 100 differs from the one shown in the FIG. 3 in that it further drives a third organic light emitting diode circuit 3 and in that it further comprises a third output terminal 13. Of the third organic light emitting diode circuit 3, a first side is coupled to the second output terminal 12 and a second side is coupled to the third output terminal 13. The driver arrangement 100 further comprises a third element 23 coupled to the third output terminal 13 and the reference terminal 10 and comprises a third switch 33 coupled to the power source terminal 14 and the third output terminal 13. The first and second and third switches 31-33 each comprise a transistor and the first and second elements 21, 22 each comprise a transistor and the third element 23 comprises a diode.

Figure 6:
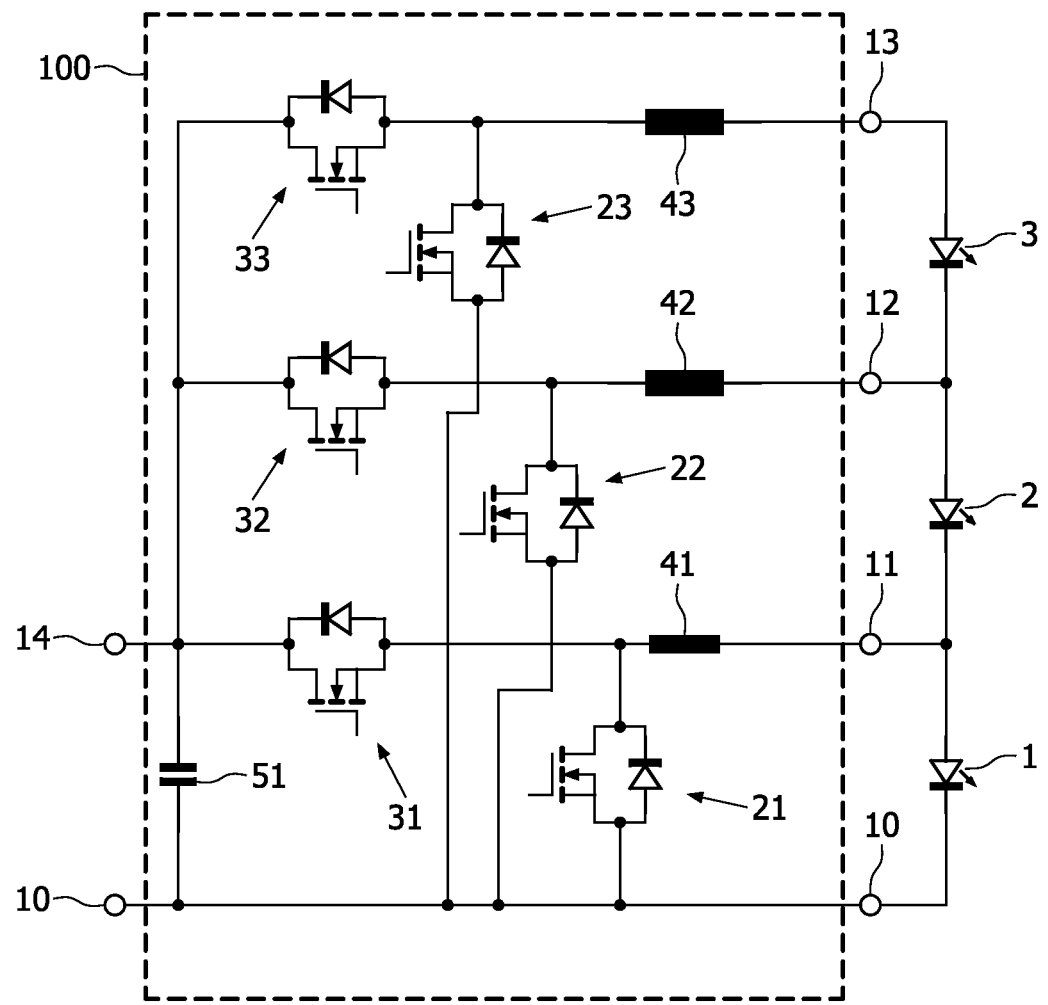
FIG. 6 shows a third embodiment of a driver arrangement.

In the FIG. 6, a third embodiment of a driver arrangement 100 is shown, that corresponds to the second embodiment shown in the FIG. 2 apart from the fact that the third element 23 comprises a transistor instead of a diode to be able to obtain synchronous switching.

Preferably, each transistor comprises an internal anti-parallel diode or is coupled to an external anti-parallel diode. Further preferably, the first element 21 and the first switch 31 are coupled to each other and their mutual electrode is coupled via a first inductor 41 to the first output terminal 11, and the second element 22 and the second switch 32 are coupled to each other and their mutual electrode is coupled via a second inductor 42 to the second output terminal 12, and the third element 23 and the third switch 33 are coupled to each other and their mutual electrode is coupled via a third inductor 43 to the third output terminal 13.

The controller 101 controls the switches 31-33 and the elements 21-23. Each output terminal 11-13 and its element 21-23 and switch 31-33 form a stage, with each stage being in one out of three modes defining a current passing this output terminal 11-13 in dependence of said controlling. The three modes comprise a continuous conduction mode, a critical/boundary conduction mode and a discontinuous conduction mode. Said control defines a duty cycle and/or a delay and/or a duration of a pulse signal to be supplied to a control electrode of said switches 31-33 and elements 21-23. Said control may comprise and/or introduce so-called synchronous switching. The setting circuit 102 sets a delay of a pulse signal to be supplied to a control electrode of said switches 31-33 and elements 21-23 in response to a comparison of reference currents defined for the organic light emitting diode circuits 1-3, as further described for the FIG. 7-27.

For a control, an amplitude modulated current control is preferred to drive monochrome organic light emitting diode (OLED) circuits 1-3. Different control methods can be applied to drive the stacked organic light emitting diode circuits 1-3, such as an analog hysteresis control, a digital hysteresis control, an analog pulse width modulation control and a digital pulse width modulation control. Additional, the following might be assumed: All components are ideal components, so losses and parasitics are neglected, the input is constant, the internal OLED circuit capacitances are large enough to keep the voltage across the OLED circuits constant, no dead time is implemented $\tau_{dead}=0$, for a design, the VI-characteristics of the OLED circuits are known, and the OLED circuits comprise three controllable colors (RGB). The driver arrangement 100 in the form of a stacked buck converter can be operated in different modes of operation. The operation mode, such as a continuous conduction mode (CCM), a discontinuous conduction mode (DCM) or a critical/boundary conduction mode (BCM), may have an impact on the stress of the components mainly determined by the different current and voltage ripples and on the losses of components.

Starting with the continuous conduction mode (CCM), it is observed that the currents through the three OLED circuits 1-3 (RGB) are difficult to be sensed directly. Hence, it is difficult to control each one of these currents directly. Therefore, the currents through the three inductors 41-43 are controlled:

$$\bar{i}_{43}=I_{OLED3}$$

$$\bar{i}_{42}=I_{OLED2}-I_{OLED3}$$

$$\bar{i}_{41}=I_{OLED1}-I_{OLED2}$$

The inductor currents $i_{42}$ and $i_{41}$ can be negative. In a first step, the current through the inductor 43 is controlled by switch 33. As a result, the current through the top OLED circuit 3 (red) is controlled.

$$U_{OLED,i}=f(I_{OLED,i})$$

$$P_{OLED,i}=U_{OLED,i}I_{OLED,i}$$

The power at the input and the output can be calculated:

$$U_{out1}=U_{OLED3}+U_{OLED2}+U_{OLED1}$$

$$P_{out1}=\bar{i}_{43}\cdot(U_{OLED3}+U_{OLED2}+U_{OLED1})$$

$$P_{in1}=U_{in}\bar{i}_{in1}$$

The inductor current ripple $\Delta i_{43}$ depends on the duty cycle $d_1$ of the first buck converter, i.e. the percentage of one switching period T during which switch 33 is turned on. An example is depicted in FIG. 7.

Figure 7:
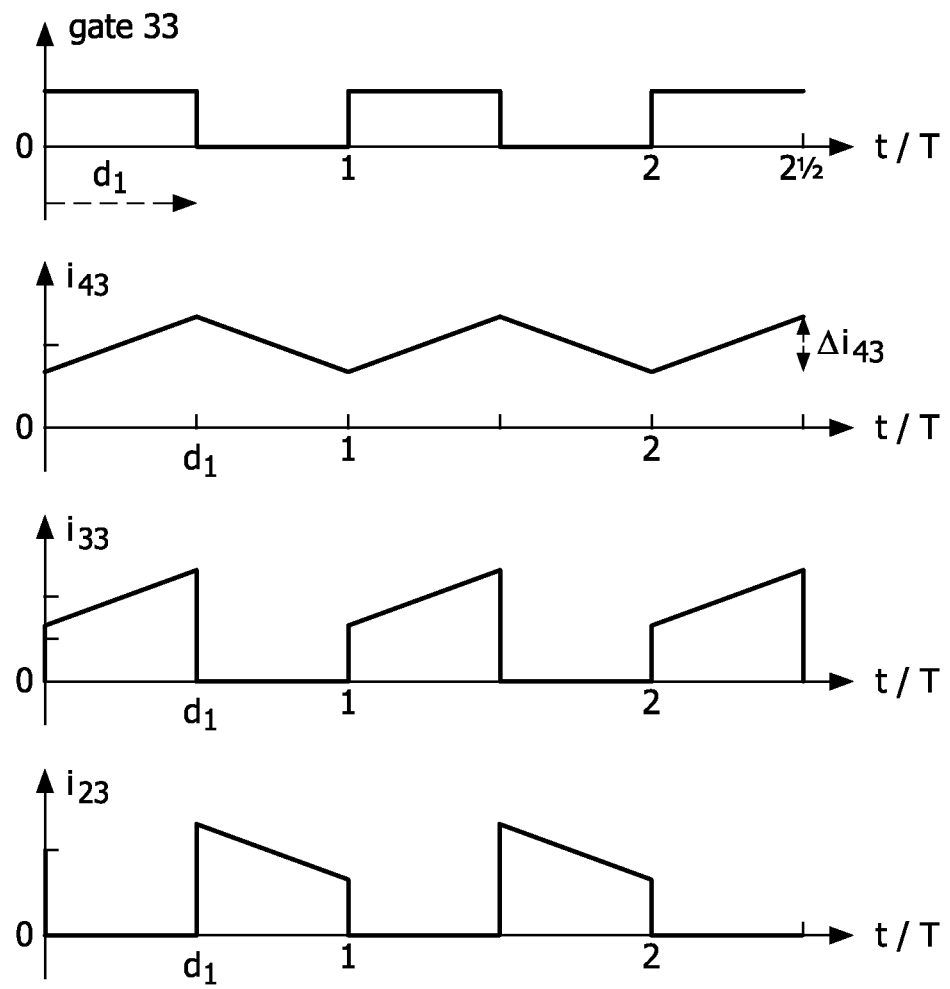
FIG. 7-15 show different controls.

In the FIG. 7, all as a function of time t per switching period T, in the upper graph a voltage signal supplied to a gate of the switch 33 is shown, in the next graph a current through the inductor 43 is shown and a ripple $\Delta i_{43}$ is shown, in the next graph a current through the switch 33 is shown, and in the lower graph a current through the element 23 is shown.

During a first part of a switching period T the current through the inductor 43 increases and during a second part this current decreases. For both time intervals, the current ripple can be calculated:

$$\Delta I_{43} = \frac{U_{in} - U_{out1}}{L_{43}} \cdot d_1 \cdot T = \frac{U_{out1}}{L_{43}} \cdot (1-d_1) \cdot T$$

$$\boxed{U_{out1} = d_1 \cdot U_{in}}$$

From these equations, the current through the switch 33 and the current through the element 23 can be calculated, see also the FIG. 7. Knowing that the input power is equal to the output power (no losses), the current through the OLED circuit 3 can be calculated.

$$P_{in1} = P_{out1} \Rightarrow U_{in} \cdot \bar{i}_{in1} = U_{out1} \cdot I_{OLED1}$$

$$\boxed{I_{OLED1} = \frac{\bar{i}_{in1}}{d_1}}$$

The light output and hence, the OLED current are set by the user. The corresponding OLED voltage is determined by the UI-characteristic of the OLED. As a result, a point of operation is fixed. With the help of the above equations, the duty cycle and the average input current can be calculated.

In a next step, the current through the inductor 42 can be controlled, resulting in an indirect control of the current through the OLED circuit 2 (green). A comparison between the two OLED reference currents determines, which switch/element is turned off and which one will control the current:

$i_{OLED3} > i_{OLED2} \Rightarrow i_{L2} < 0$ switch 32 turned off, element 22 controlled $i_{OLED3} \leq i_{OLED2} \Rightarrow i_{L2} > 0$ switch 32 controlled, element 22 turned off Depending on the direction of the current through the second inductor 42 either the switch 32 or the element 22 is turned off and the other one is used to control the current through the inductor 42. So for a negative inductor current $i_{42}$, the switch 32 is turned off during the complete switching period. Its intrinsic diode conducts the current, when the element 22 is turned off. So-called synchronous switching is thereby not to be excluded: When an anti-parallel diode of a transistor (that normally would be switched off) is conducting current, this transistor may be switched on during said conducting to reduce the dissipation in the anti-parallel diode. An example for a negative inductor current $i_{42}$ is depicted in the FIG. 8. The equations are found similarly to the equations of the upper stage.

Figure 8:
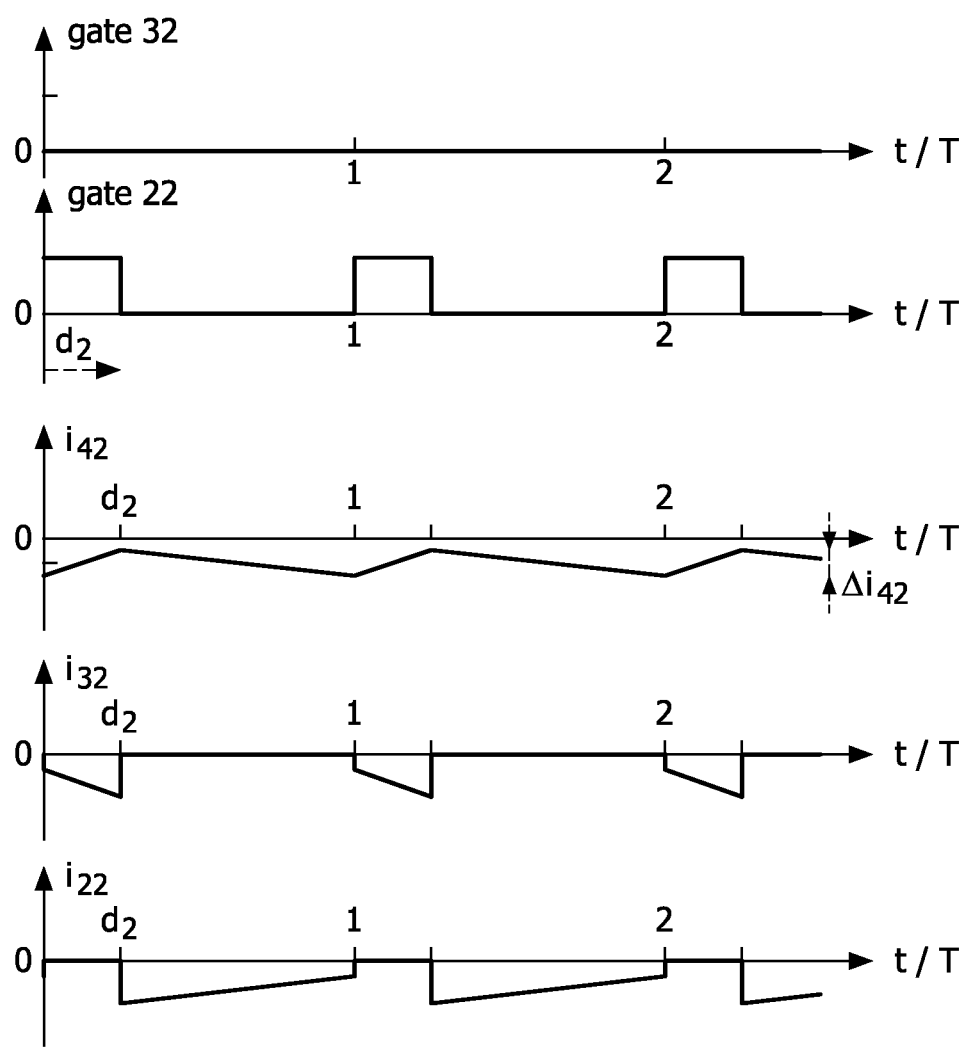

In the FIG. 8, all as a function of time t per switching period T, in the upper graph a voltage signal supplied to a gate of the switch 32 is shown, in the next graph a voltage signal supplied to a gate of the switch 22 is shown, in the next graph a current through the inductor 42 is shown and a ripple $\Delta i_{42}$ is shown, in the next graph a current through the switch 32 is shown, and in the lower graph a current through the element 22 is shown. The power at the input and the output can be calculated:

$$U_{out2} = U_{OLED2} + U_{OLED1}$$

$$P_{out2} = \bar{i}_{42} \cdot (U_{OLED2} + U_{OLED1}) = (I_{OLED2} - I_{OLED3}) \cdot (U_{OLED2} + U_{OLED1})$$

$$P_{in2} = U_{in} \cdot \bar{i}_{in2}$$

The current ripple can be calculated:

$$\Delta I_{42} = \frac{U_{in} - U_{out2}}{L_{42}} \cdot d_2 \cdot T = \frac{U_{out2}}{L_{42}} \cdot (1 - d_2) \cdot T$$

$$\boxed{U_{out2} = d_2 \cdot U_{in}}$$

$$P_{in2} = P_{out2} \Rightarrow U_{in} \cdot \bar{i}_{in2} = U_{out2} \cdot \bar{i}_{42}$$

$$\boxed{I_{OLED2} - I_{OLED3} = \bar{i}_{42} = \frac{\bar{i}_{in2}}{d_2}}$$

In a next step, the current through the inductor 41 can be controlled, resulting in an indirect control of the current through the OLED circuit 3 (blue). A comparison between the two OLED reference currents determines which switch is turned off and which one will control the current:

$i_{OLED2} > i_{OLED1} \Rightarrow i_{41} < 0$ switch 31 turned off, element 21 controlled $i_{OLED2} \leq i_{OLED1} \Rightarrow i_{41} > 0$ switch 31 controlled, element 21 turned off The power at the input and the output can be calculated to:

$$U_{out3} = U_{OLED1}$$

$$P_{out3} = \bar{i}_{L3} \cdot U_{OLED1} = (I_{OLED1} - I_{OLED2}) \cdot U_{OLED1}$$

$$P_{in3} = U_{in} \cdot \bar{i}_{in3}$$

For the current ripple, one finds:

$$\Delta I_{41} = \frac{U_{in} - U_{out3}}{L_{41}} \cdot d_3 \cdot T = \frac{U_{out3}}{L_{41}} \cdot (1 - d_3) \cdot T$$

$$\boxed{U_{out3} = d_3 \cdot U_{in}}$$

$$P_{in3} = P_{out3} \Rightarrow U_{in} \cdot \bar{i}_{in3} = U_{out3} \cdot \bar{i}_{41}$$

$$\boxed{I_{OLED1} - I_{OLED2} = \bar{i}_{41} = \frac{\bar{i}_{in3}}{d_3}}$$

The sum of the three input powers result in the total input power.

$$P_{in} = P_{in1} + P_{in2} + P_{in3} = U_{in} \cdot I_{in}$$

$$I_{in} = \bar{i}_{in1} + \bar{i}_{in2} + \bar{i}_{in3}$$

Figure 9:
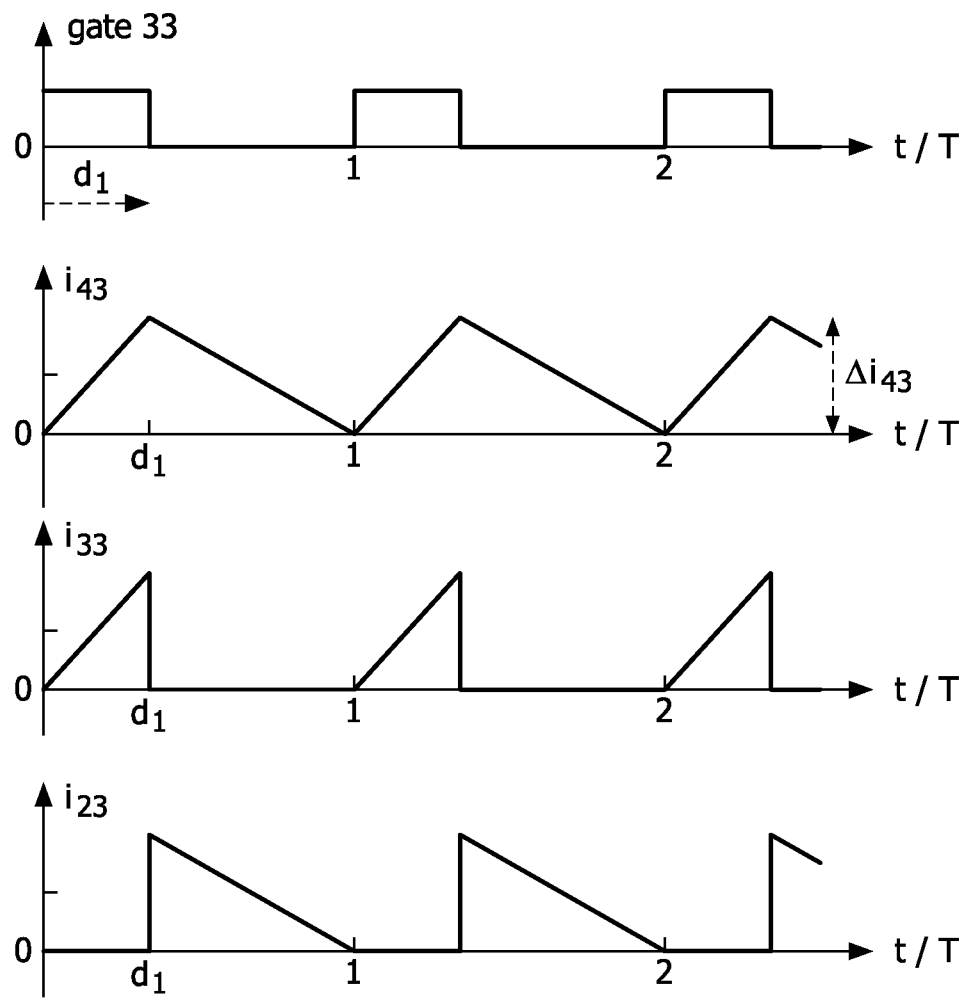

The critical/boundary conduction mode (BCM) is shown in the FIG. 9. In the FIG. 9, all as a function of time t per switching period T, in the upper graph a voltage signal supplied to a gate of the switch 33 is shown, in the next graph a current through the inductor 43 is shown and a ripple $\Delta i_{43}$ is shown, in the next graph a current through the switch 33 is shown, and in the lower graph a current through the element 23 is shown.

Critical or boundary conduction mode operation can be used in many applications to increase the efficiency, because zero voltage switching can be achieved in this mode. The equations in this mode are identical to the equations in the CCM. Further, the average inductor current is equal to half the current ripple.

$$\bar{i}_{43} = \frac{\Delta i_{43}}{2} = \frac{d_1 \cdot (1 - d_1) \cdot U_{in}}{2 \cdot f_{sw} \cdot L_{43}}$$

$$\bar{i}_{42} = \frac{\pm \Delta i_{42}}{2} = \begin{cases} \dfrac{+d_2 \cdot (1 - d_2) \cdot U_{in}}{2 \cdot f_{sw} \cdot L_{42}} & \text{if } i_{OLED2} > i_{OLED3} \\ \dfrac{-d_2 \cdot (1 - d_2) \cdot U_{in}}{2 \cdot f_{sw} \cdot L_{42}} & \text{if } i_{OLED2} \leq i_{OLED3} \end{cases}$$

$$\bar{i}_{41} = \frac{\pm \Delta i_{41}}{2} = \begin{cases} \dfrac{+d_3 \cdot (1 - d_3) \cdot U_{in}}{2 \cdot f_{sw} \cdot L_{41}} & \text{if } i_{OLED1} > i_{OLED2} \\ \dfrac{-d_3 \cdot (1 - d_3) \cdot U_{in}}{2 \cdot f_{sw} \cdot L_{41}} & \text{if } i_{OLED1} \leq i_{OLED2} \end{cases}$$

Valley switching can be implemented to obtain zero voltage switching. It is not necessary to operate all stage in the same mode. It is also possible, for example, to operate only one stage in the BCM and the other two stages in the CCM.

Figure 10:
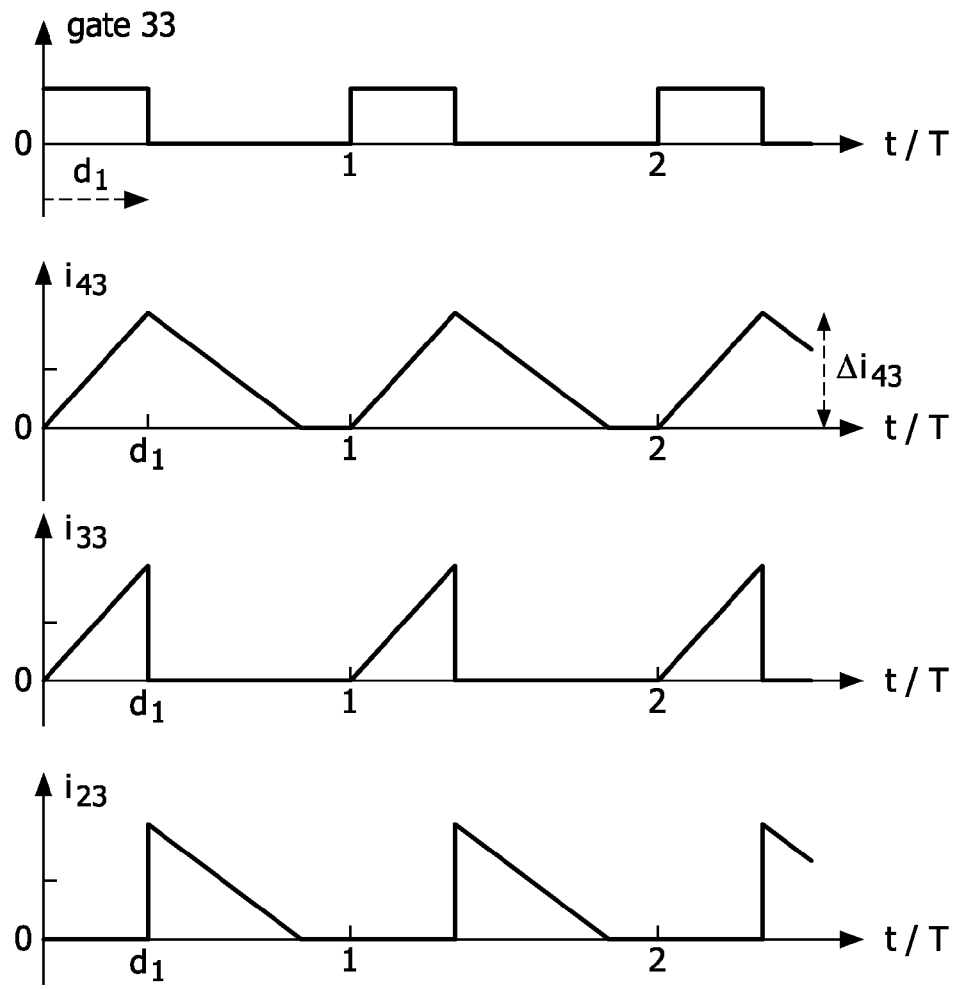

The discontinuous conduction mode (DCM) is shown in the FIG. 10. In the FIG. 10, all as a function of time t per switching period T, in the upper graph a voltage signal supplied to a gate of the switch 33 is shown, in the next graph a current through the inductor 43 is shown and a ripple $\Delta i_{43}$ is shown, in the next graph a current through the switch 33 is shown, and in the lower graph a current through the element 23 is shown.

Figure 11:
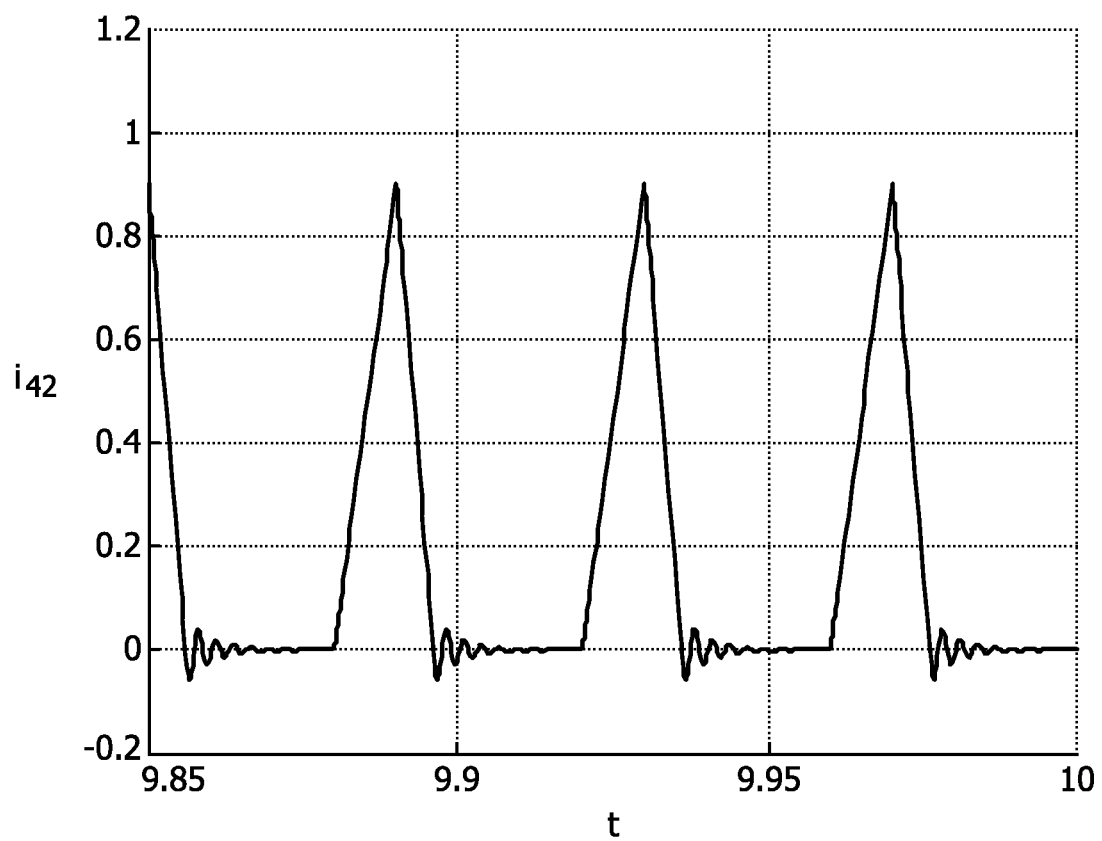
Figure 12:
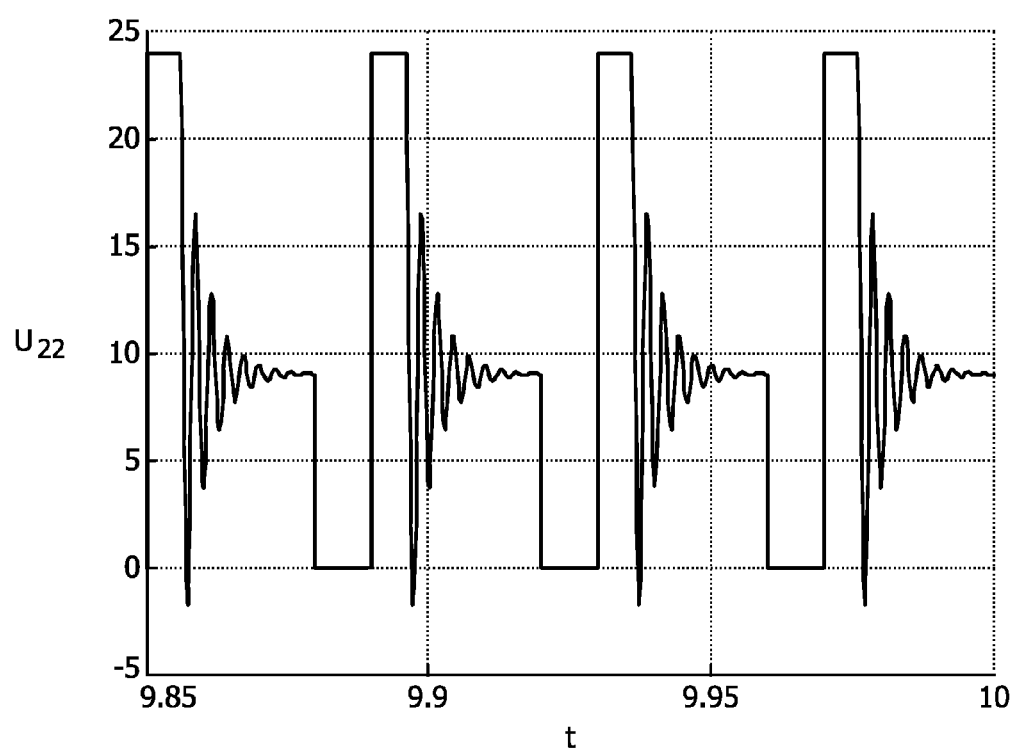

In DCM, the inductor current becomes zero for a short period. In practice however, oscillations occur at the instant the inductor current becomes zero. A simulation example is depicted in FIG. 11 (current through inductor 42 versus time in msec.) and FIG. 12 (voltage across element 22 versus time in msec.). These oscillations can be used to obtain zero voltage switching. In the example, the top transistor (in this case switch 32), has to be turned on, when the voltage across the element 22 reaches a minimum. By doing so, valley switching is applied. The FIGS. 11 and 12 clearly show that it is best to turn-on the switch 32 (the element 22 has to be turned off already), at the first minimum, the voltages crosses zero. Hence, zero voltage switching has been achieved. In the example, turn-on at the second minimum does not result in full zero voltage switching, because the oscillation is damped. The longer one waits, the more switching losses will occur. Therefore, zero voltage switching can only be achieved for some points of operation.

Note that zero voltage switching at turn-off of the switches 31-33 is achieved at every instant and at every point of operation as long as the current flowing through the inductance is large enough. Zero voltage switching of the elements 21-23 is not achieved at every point of operation. A solution to obtain zero voltage switching in all points of operation is to apply synchronous switching, as can be easily achieved for the first and second stages. Using synchronous switching, the inductor current can become negative as demonstrated in the theoretical example of the FIG. 13. After the inductor current has become negative, the element 22 is turned off. Now, the current commutates to the intrinsic diode of the switch 32 resulting in a negligible voltage drop across this transistor, which can now be turned on lossless.

Figure 13:
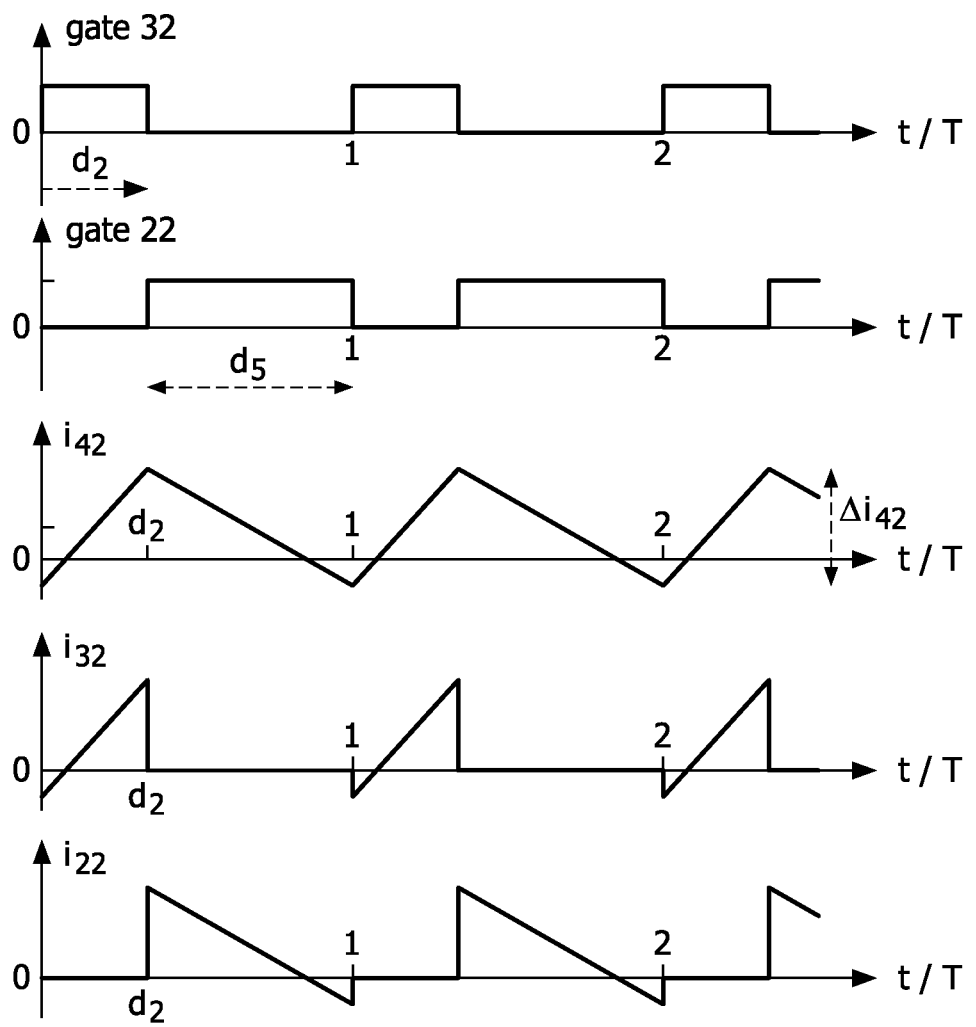

In the FIG. 13, all as a function of time t per switching period T, in the upper graph a voltage signal supplied to a gate of the switch 32 is shown, in the next graph a voltage signal supplied to a gate of the element 22 is shown, in the next graph a current through the inductor 42 is shown and a ripple $\Delta i_{42}$ is shown, in the next graph a current through the switch 32 is shown, and in the lower graph a current through the element 22 is shown.

To go to an optimized switching scheme, it must be noted that all three stages draw the input current from one input, i.e. from the same input capacitor 51. Assuming that the input capacitance is large, the input capacitor 51 will filter the complete AC ripple. Hence, the current drawn from the supply $I_{source}=I_{in}$ is a pure DC current.

$$i_{in}=i_{33}+i_{32}+i_{31}$$

$$I_{in}=\bar{i}_{33}+\bar{i}_{32}+\bar{i}_{31}$$

$$i_{51}=i_{33}+i_{32}+i_{31}-I_{in}$$

Figure 14:
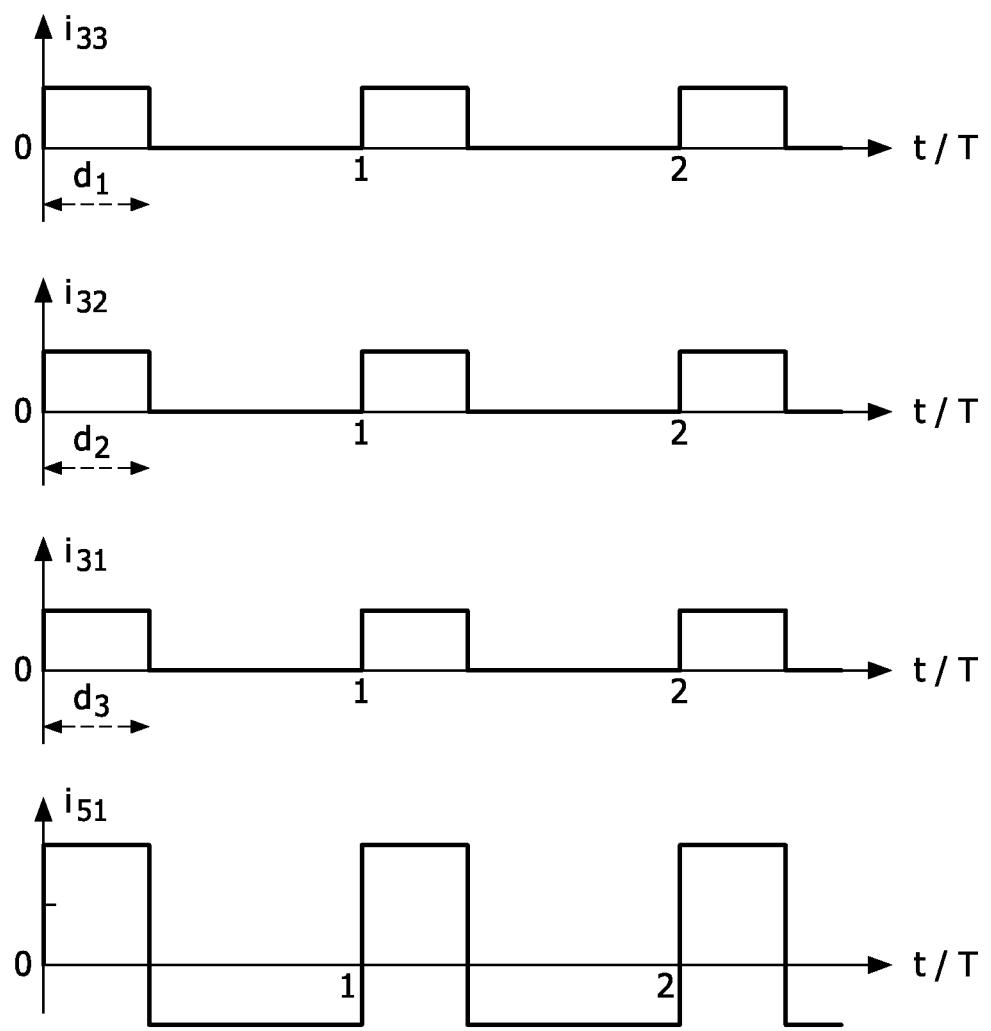
Figure 15:
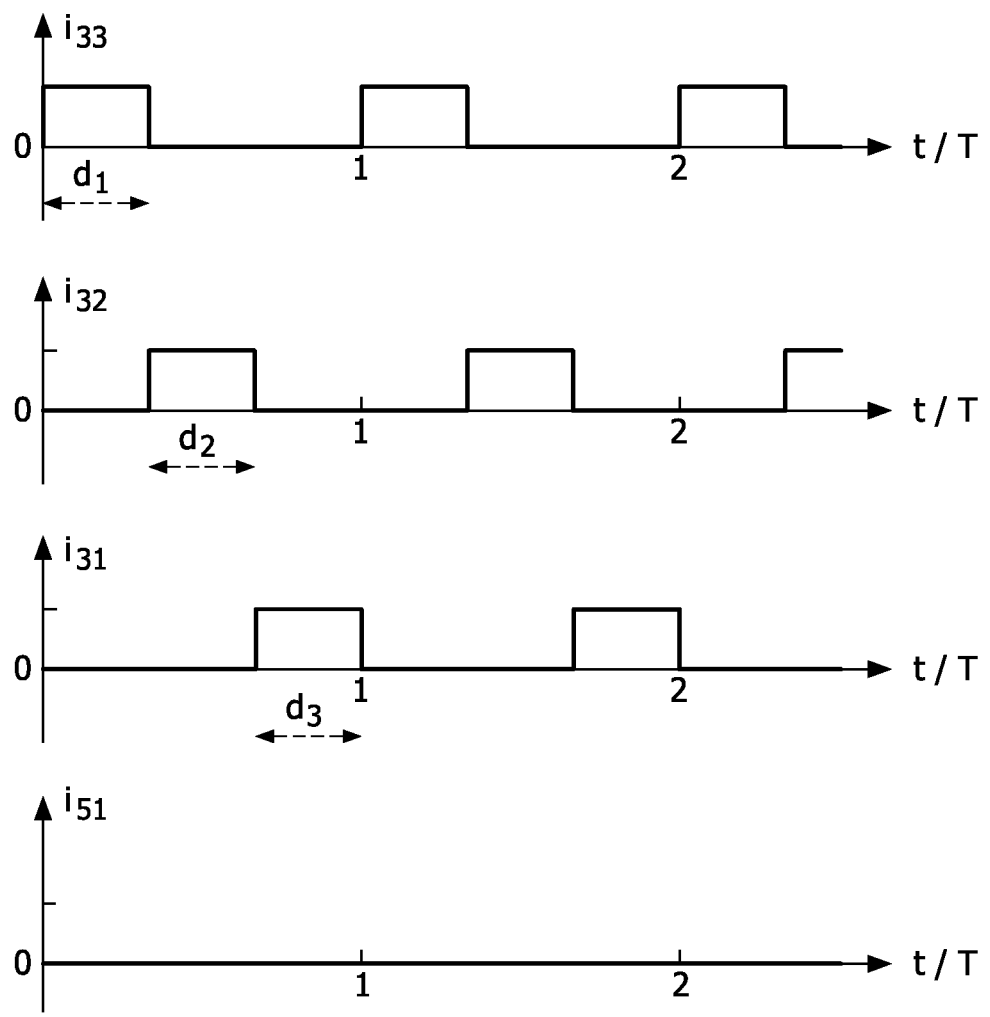
Figure 16:
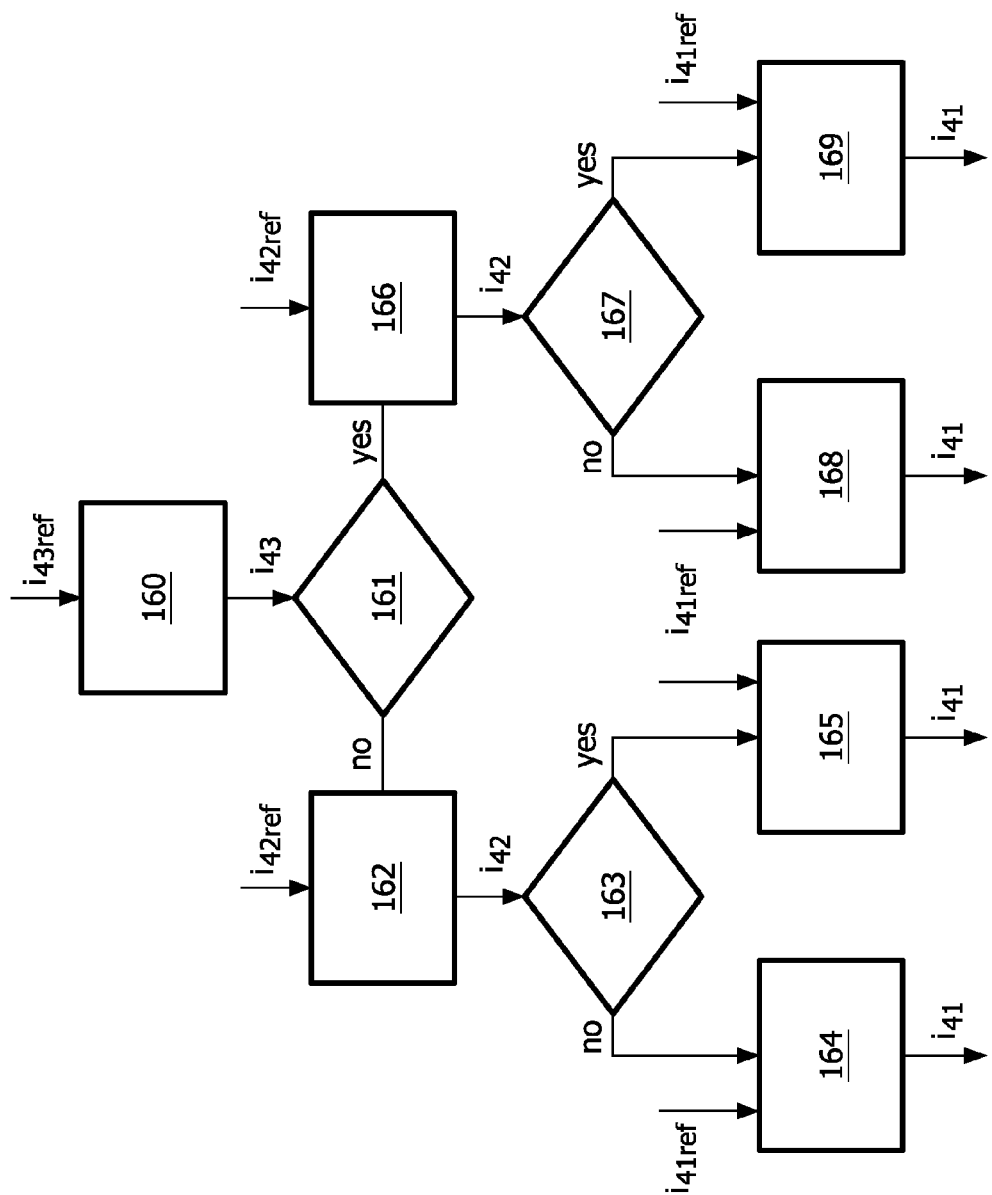
FIG. 16 shows a control scheme.

Two examples are depicted in the FIGS. 14 and 15. In the FIG. 14, the phase-shift between the transistor current $i_{33}$, $i_{32}$ and $i_{31}$ is set to zero. As a result, the current $i_{51}$ through the input capacitor 51 is relatively large. In the FIG. 15, the phase-shift of the second control signal is 120° and the phase-shift of the third signal is 240°. Hence, the current ripple is a lot smaller. In fact, in the example, the complete ripple has disappeared.

Unfortunately, a phase-shift of 120° and 240° for the second and third control signal does not always guarantee the smallest current ripple in the input capacitor 51. The smallest current ripple can be achieved by using the control scheme depicted in the FIG. 16. In the FIG. 16, the following blocks have the following meaning (whereby the third control stage comprises the switch 33 and the element 23, the second control stage comprises the switch 32 and the element 22, the first control stage comprises the switch 31 and the element 21):

160 third control stage $T_{delay1}=0$
161 $i_{42ref}>i_{43ref}$? if yes goto 166, if no goto 162
162 second control stage $T_{delay2}=0$
163 $i_{41ref}>i_{42ref}$? if yes goto 165, if no goto 164
164 first control stage $T_{delay3}=d_2T$
165 first control stage $T_{delay3}=d_1T$
166 second control stage $T_{delay2}=d_1T$
167 $i_{41ref}>i_{42ref}$? if yes goto 169, if no goto 168
168 first control stage $T_{delay3}=0$
169 first control stage $T_{delay3}=(d_1+d_2)T$ So, by choosing $i_{41ref}$ and $i_{42ref}$ and $i_{43ref}$ and by comparing them with each other a delay per stage can be calculated.

Some simulation results are shown in the FIG. 17-27. In the simulation model, two control techniques have been implemented, hysteresis current control and pulse width modulation current control. All components are assumed to be ideal. The following parameters have been used: $U_{in}=24$ V, $U_{diodeR}=U_{diodeG}=U_{diodeB}=0$ V, $R_{diodeR}=R_{diodeG}=R_{diodeB}=2\Omega$, $L_{43}=L_{42}=L_{41}=100$ μH, $U_{diode}=0.6$ V, $I_{OLED3ref}=3$ A, $I_{OLED2ref}=1$ A, $I_{OLED1ref}=2$ A, $f_{sw}=f_{sw1}=f_{sw2}=f_{sw3}=200$ kHz.

Figure 17:
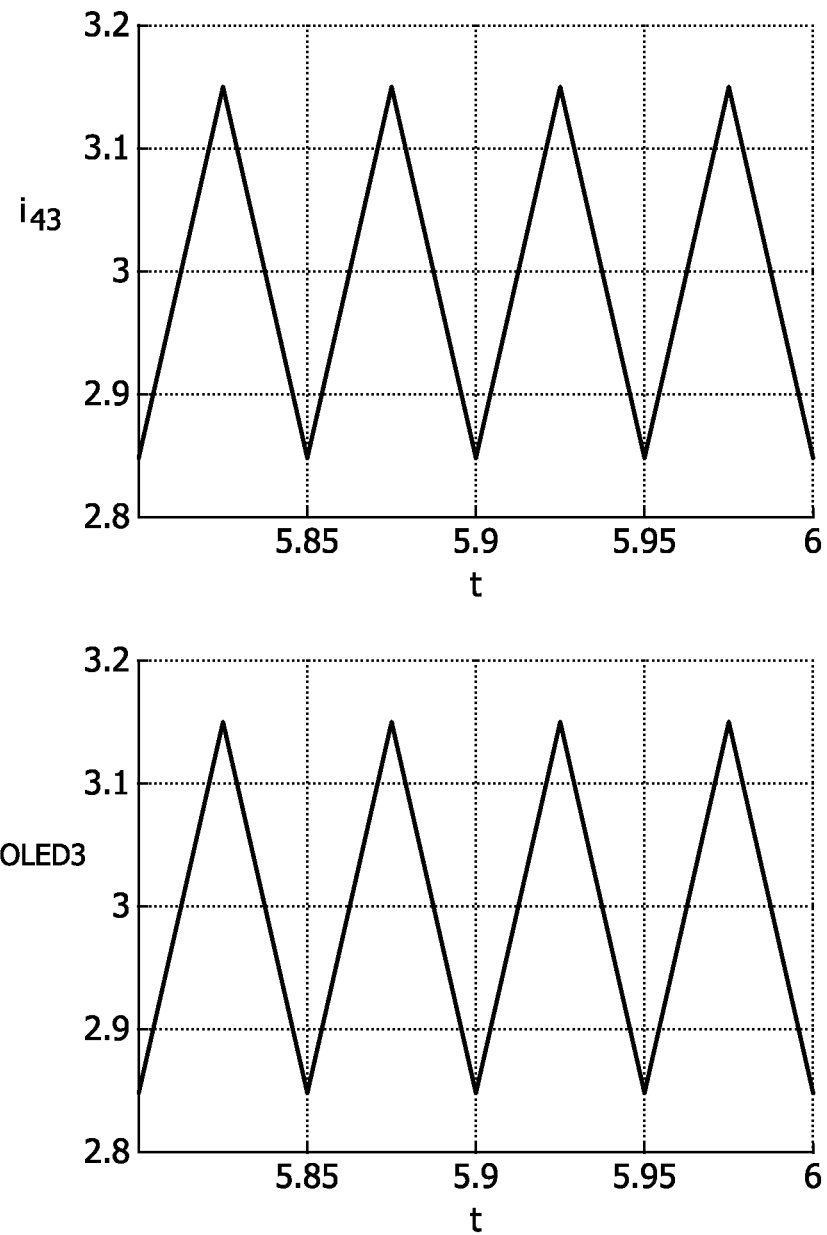
FIG. 17-27 show simulation results.
Figure 18:
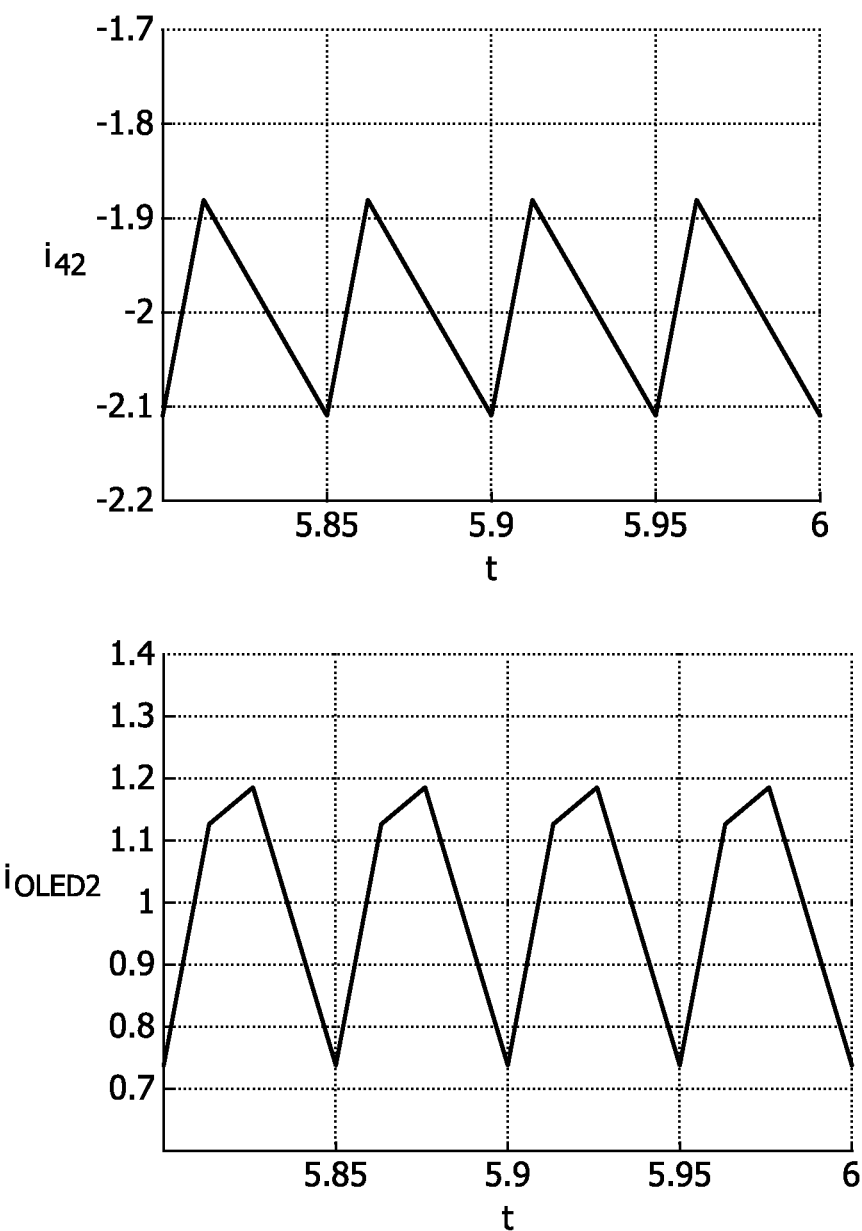
Figure 19:
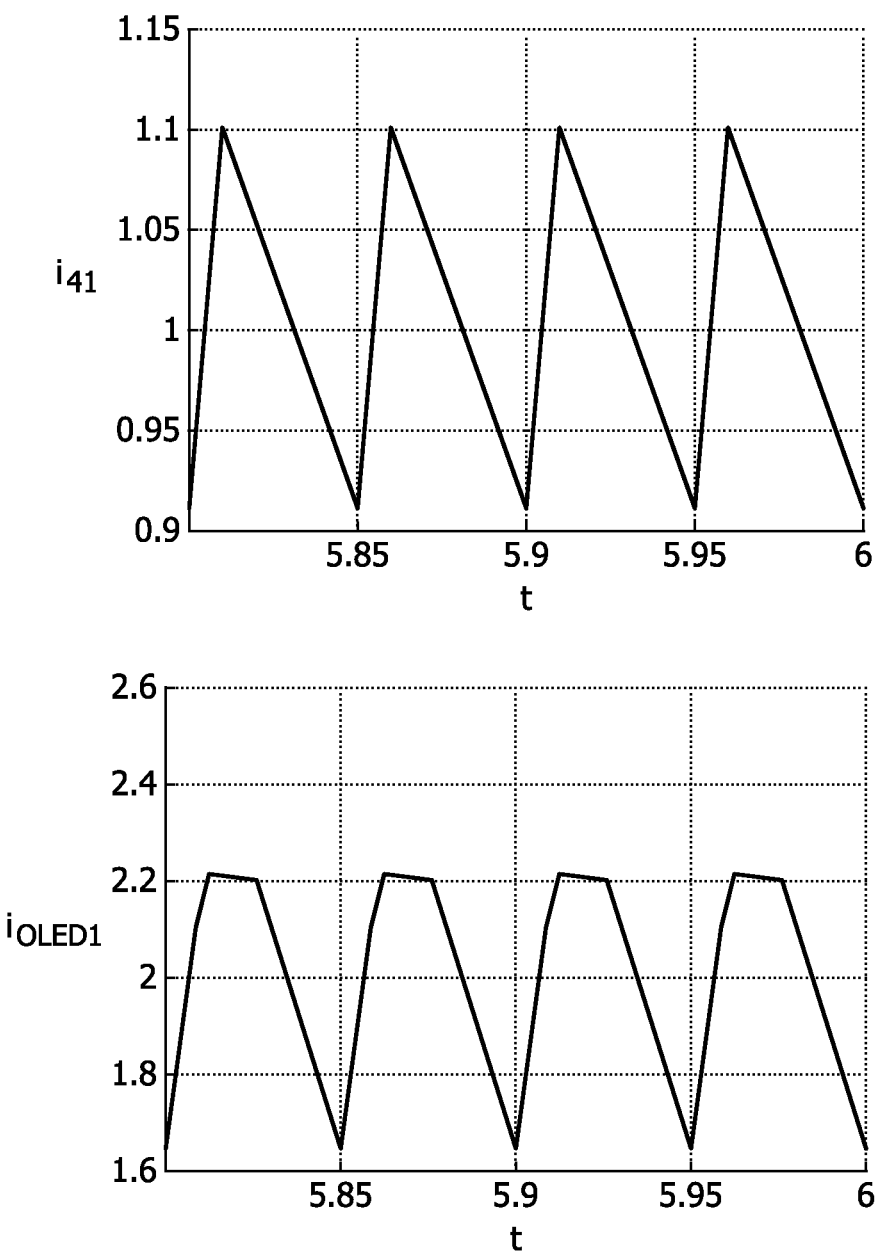
Figure 20:
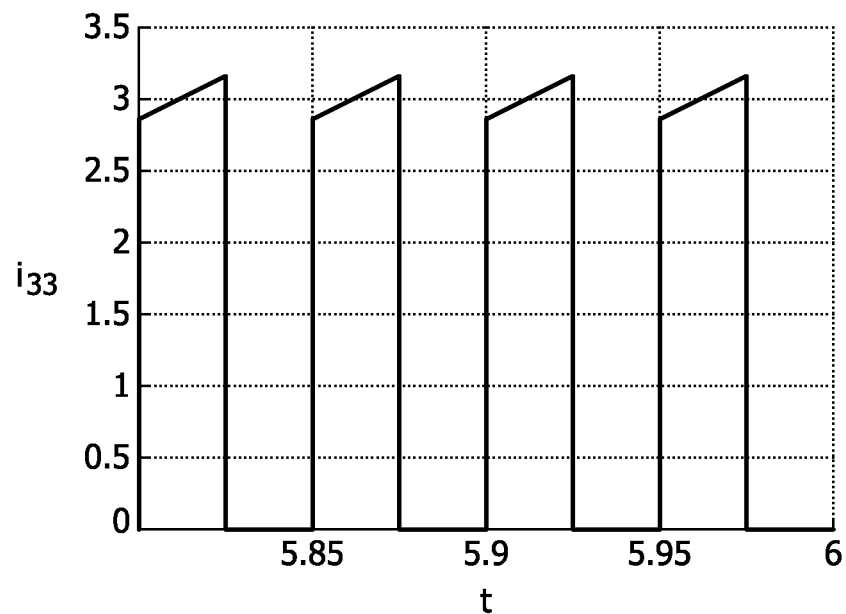
Figure 20:
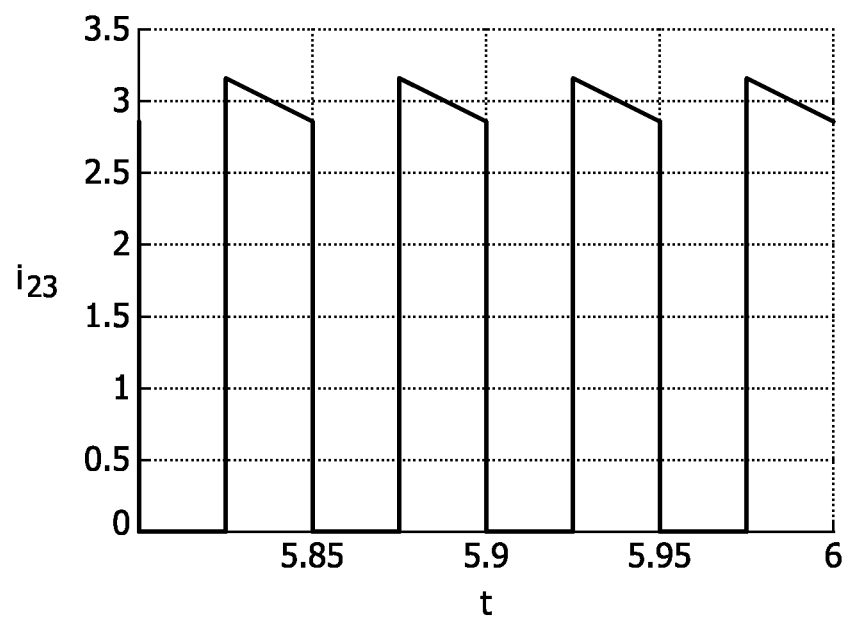
Figure 21:
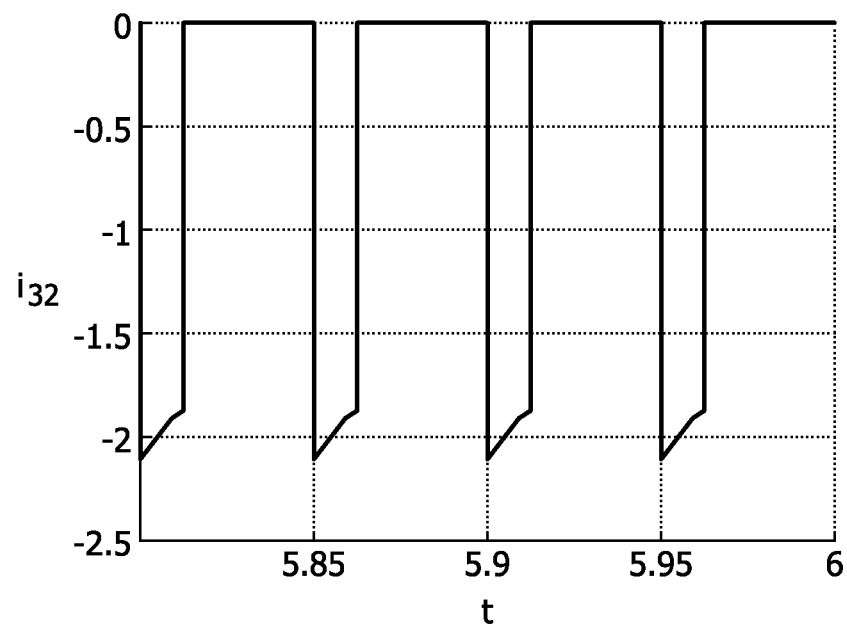
Figure 21:
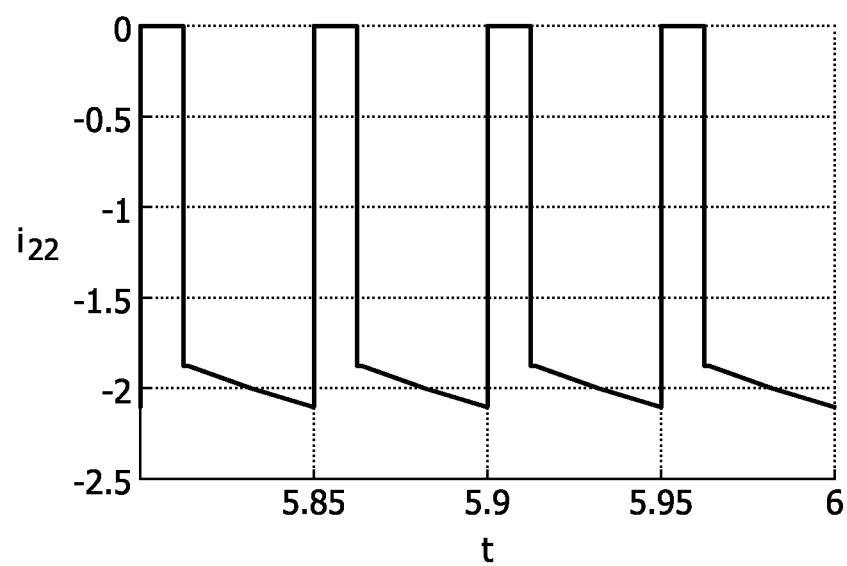
Figure 22:
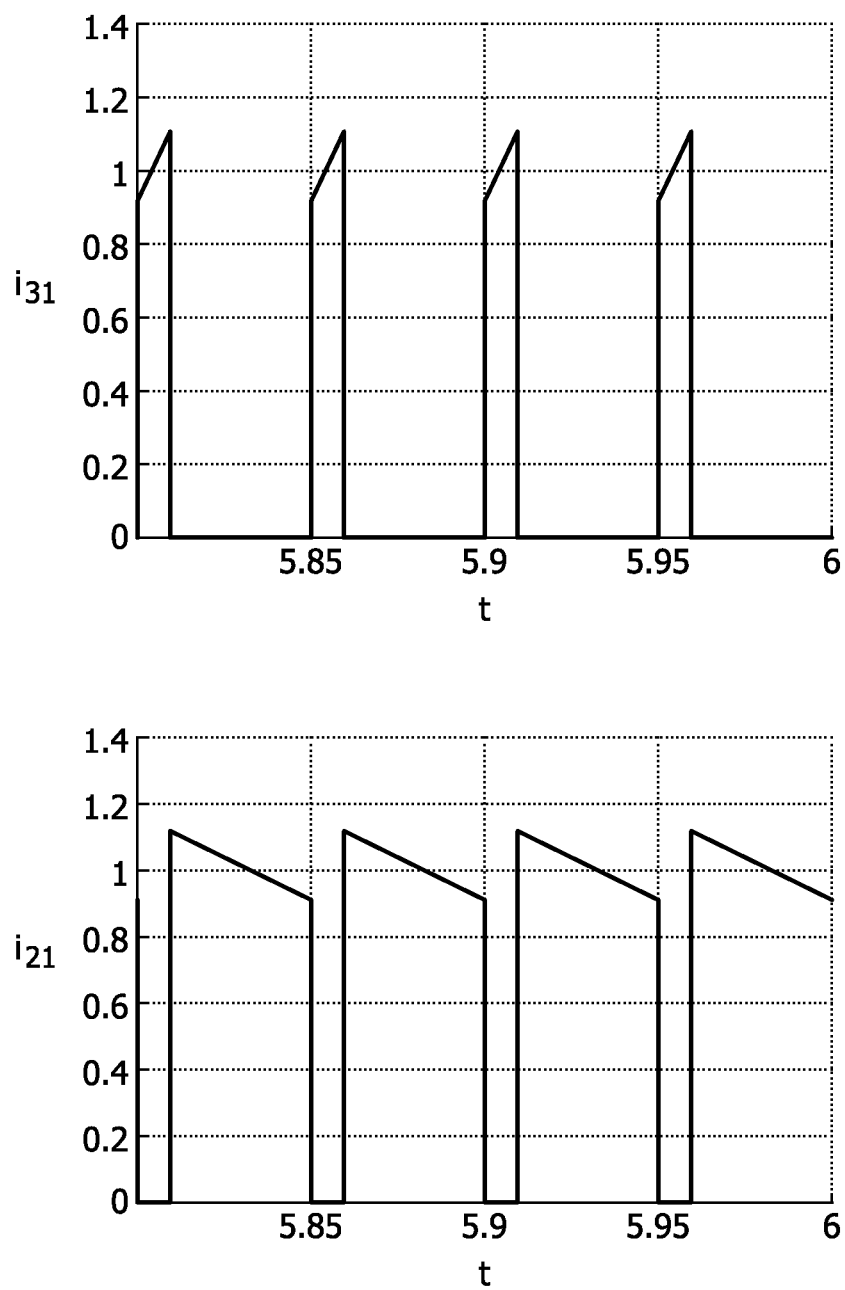
Figure 23:
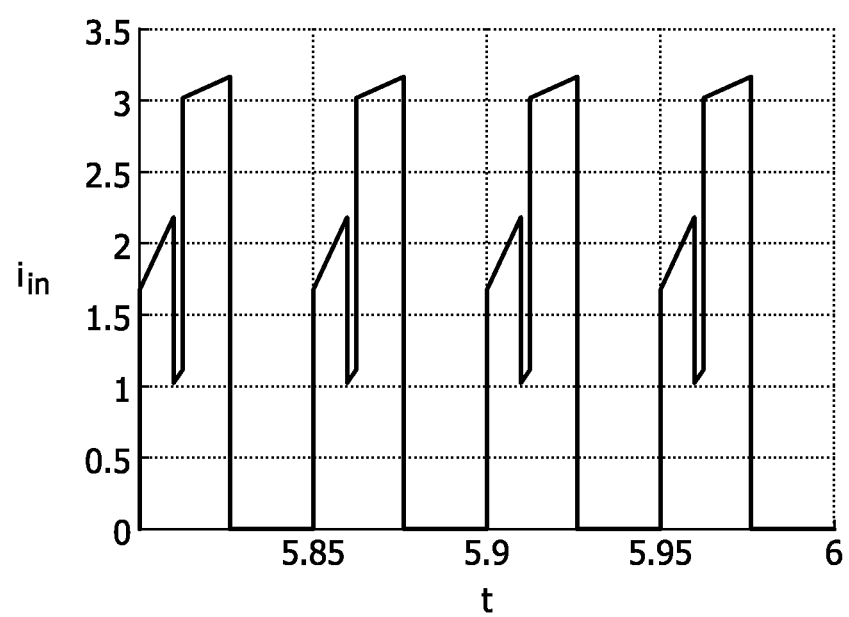
Figure 24:
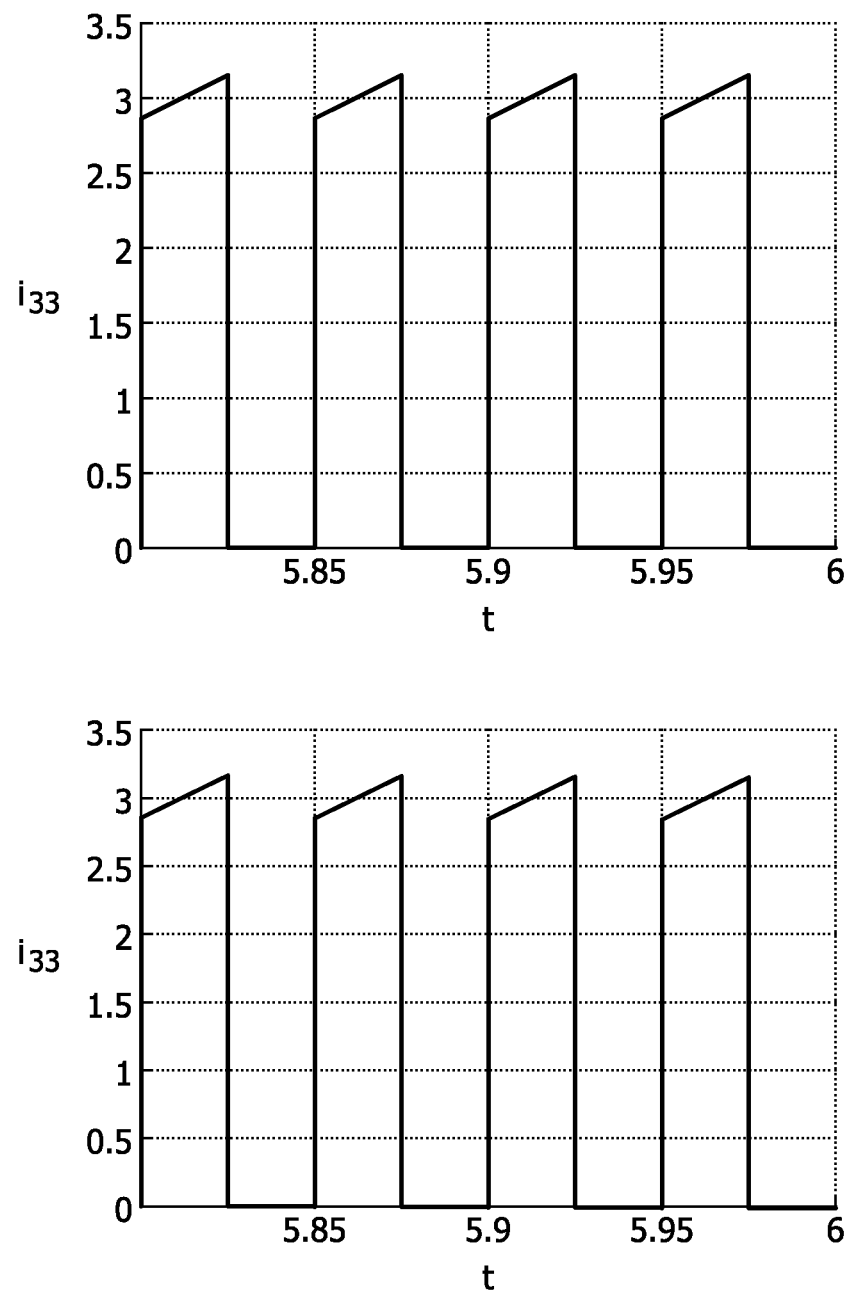
Figure 25:
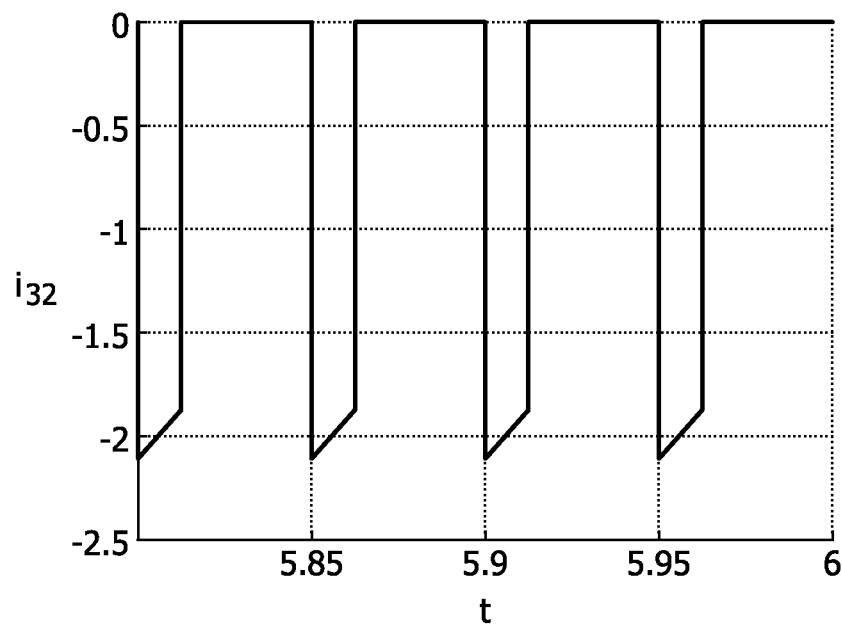
Figure 25:
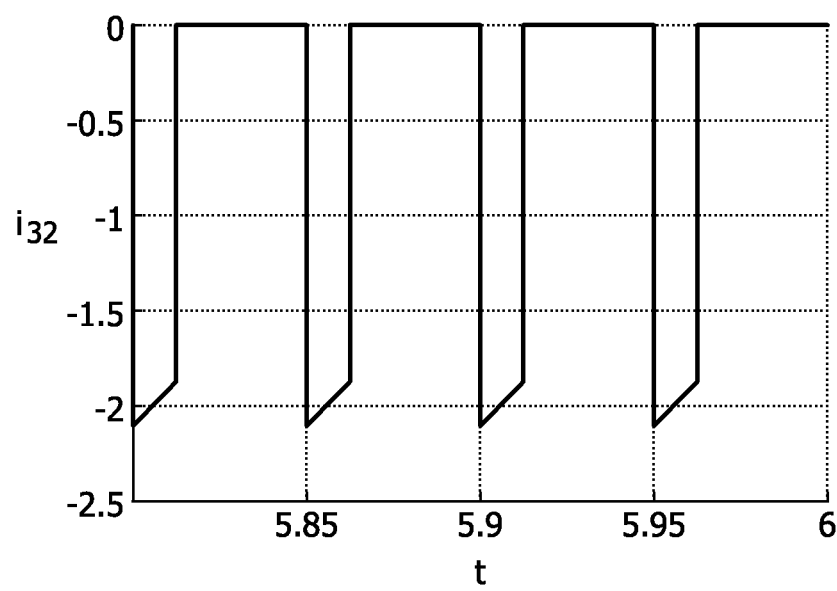
Figure 26:
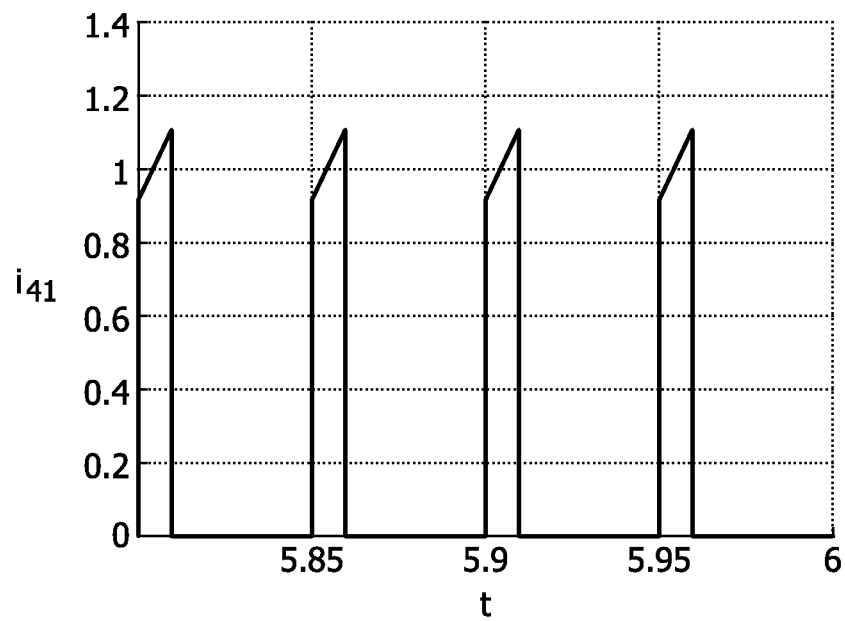
Figure 26:
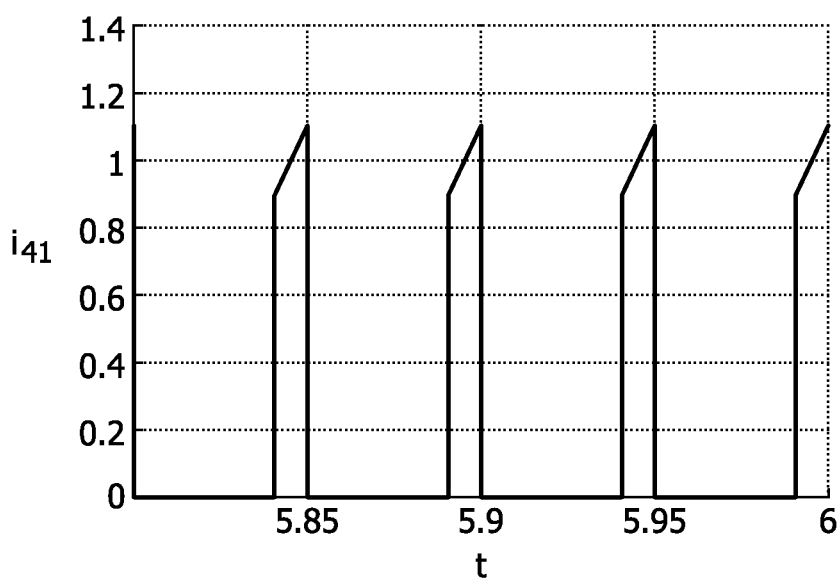
Figure 27:
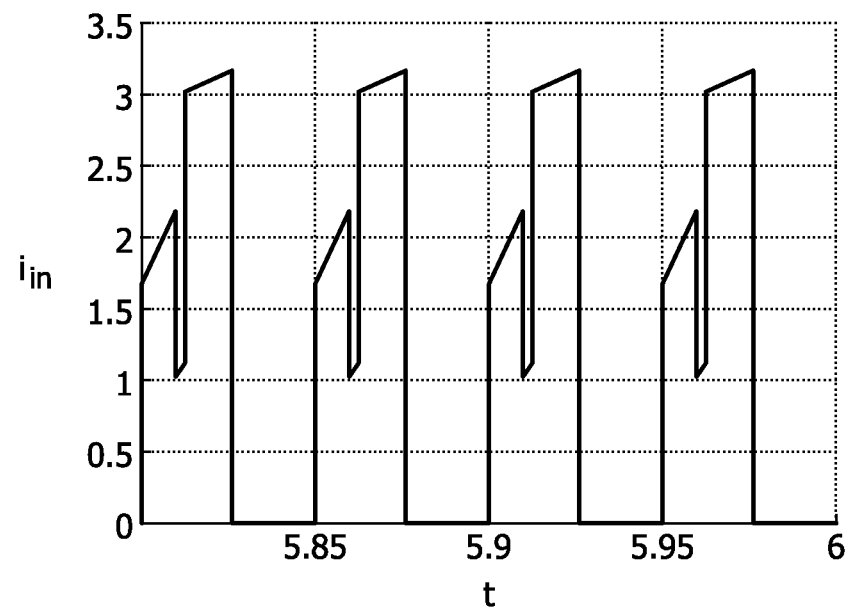
Figure 27:
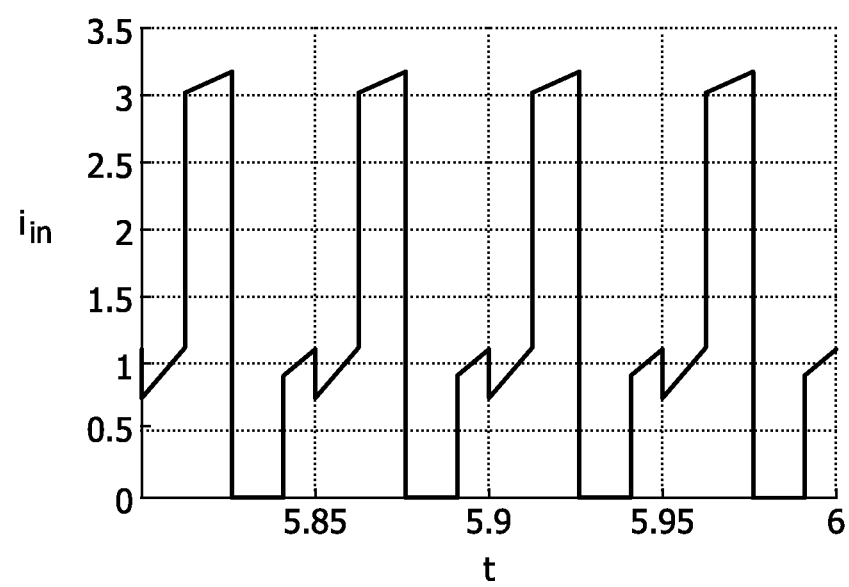

FIG. 17-19 depict the currents through the three inductors $i_{43}$, $i_{42}$, $i_{41}$ and the resulting OLED currents $i_{oLED3}$, $i_{oLED2}$, $i_{oLED1}$ (current in Ampere versus time in $10^{-4}$ sec.). The currents through the switches 31-33 are depicted in the FIG. 20-23 (current in Ampere versus time in $10^{-4}$ sec.). The resulting input current $i_{in}$, which is the sum of the first three transistors currents, is also depicted. The impact of the phase-shift of the control signals is demonstrated with the help of the two examples depicted in the FIG. 24-27 (current in Ampere versus time in $10^{-4}$ sec. and the upper graphs show the first phase shift and the lower graphs show the second phase shift).

Summarizing, driver arrangements 100 drive first organic light emitting diode circuits 1 coupled to reference terminals 10 and first output terminals 11 and drive second organic light emitting diode circuits 2 coupled to the first output terminals 11 and to second output terminals 12. The driver arrangements 100 comprise first/second elements 21/22 coupled to the first/second output terminals 11 and the reference terminals 10 and first/second switches 31/32 coupled to power source terminals 14 and the first/second output terminals 11/12 for controlling the stacked organic light emitting diode circuits 1, 2 individually. The switches 31, 32 and the first elements 21 comprise transistors and the second elements 22 comprise transistors or diodes. The first/second elements 21/22 and the first/second switches 31/32 are coupled to each other and via first/second inductors 41/42 to the first/second output terminals 11/12.

The switches 31, 32 and the elements 21, 22 may in addition comprise further components, such as one or more resistors, one or more capacitors and/or one or more coils. An organic light emitting diode circuit 1, 2, 3 is usually driven via an inductor 41, 42, 43, which inductor 41, 42, 43 may form part of the driver arrangement 100 or may form part of the organic light emitting diode circuit 1, 2, 3 or may be located between the driver arrangement 100 and the organic light emitting diode circuit 1, 2, 3.

While the invention has been illustrated and described in detail in the drawings and foregoing description, such illustration and description are to be considered illustrative or exemplary and not restrictive; the invention is not limited to the disclosed embodiments. For example, it is possible to operate the invention in an embodiment wherein different parts of the different disclosed embodiments are combined into a new embodiment.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality.

A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A driver arrangement for driving first and second organic light emitting diode circuits, the driver arrangement comprising:
    a reference terminal,
    a power source terminal, and
    first and second output terminals,
    the first organic light emitting diode circuit comprising a first side to be coupled to the reference terminal and a second side to be coupled to the first output terminal,
    the second organic light emitting diode circuit comprising a first side to be coupled to the first output terminal and a second side to be coupled to the second output terminal, and
    the driver arrangement comprising:
    a first element coupled to the first output terminal and the reference terminal, and a first switch coupled to the power source terminal and the first output terminal, and
    a second element coupled to the second output terminal and the reference terminal, and a second switch coupled to the power source terminal and the second output terminal, the first element and the first switch being coupled to each other and via a first inductor to the first output terminal, and the second element and the second switch being coupled to each other and via a second inductor to the second output terminal, wherein the first and second elements are coupled in parallel to the first and second organic light emitting diode circuits.

2. The driver arrangement as claimed in claim 1, the switches comprising transistors, and one of the first and second elements comprising a transistor and another one of the first and second elements comprising a transistor or a diode.

3. The driver arrangement as claimed in claim 2, each transistor comprising an internal anti-parallel diode or being coupled to an external anti-parallel diode.

4. The driver arrangement as claimed in claim 1, further comprising a controller for controlling the switches and at least one element.

5. The driver arrangement as claimed in claim 4, each output terminal and its element and switch forming a stage, each stage being in one out of three modes defining a current passing this output terminal in dependence of said controlling.

6. The driver arrangement as claimed in claim 5, the three modes comprising a continuous conduction mode, a critical/boundary conduction mode and a discontinuous conduction mode.

7. The driver arrangement as claimed in claim 4, said controlling defining a duty cycle and/or a delay and/or a duration of a pulse signal to be supplied to a control electrode of one or more of said switches and element, and/or said controlling comprising synchronous switching.

8. The driver arrangement as claimed in claim 4, the controller comprising a setting circuit for setting a delay of a pulse signal to be supplied to a control electrode of one or more of said switches and element in response to a comparison of reference currents defined for the organic light emitting diode circuits.

9. A device comprising the driver arrangement as claimed in claim 1 and further comprising the first and second organic light emitting diode circuits.

10. The device as claimed in claim 9, the first and second organic light emitting diode circuits being coupled to each other in a stacked construction.

11. The device as claimed in claim 9, each organic light emitting diode circuit providing blue, green, red or yellow light.

12. A driver arrangement for driving at least first, second, and third organic light emitting diode circuits, the driver arrangement comprising:
    a reference terminal,
    a power source terminal, and
    first, second, and third output terminals, the first organic light emitting diode circuit comprising a first side to be coupled to the reference terminal and a second side to be coupled to the first output terminal, the second organic light emitting diode circuit comprising a first side to be coupled to the first output terminal and a second side to be coupled to the second output terminal, the third organic light emitting diode circuit comprising a first side to be coupled to the second output terminal and a second side to be coupled to the third output terminal, and the driver arrangement comprising:
    a first element coupled to the first output terminal and the reference terminal, and a first switch coupled to the power source terminal and the first output terminal, and
    a second element coupled to the second output terminal and the reference terminal, and a second switch coupled to the power source terminal and the second output terminal, wherein the first and second elements are coupled in parallel to the first and second organic light emitting diode circuits, the driver arrangement further comprising a third element coupled to the third output terminal and the reference terminal and a third switch coupled to the power source terminal and the third output terminal,
    the switches comprising transistors and two of the elements comprising transistors and the other element comprising a transistor or a diode, each transistor comprising an internal anti-parallel diode or being coupled to an external anti-parallel diode, the first element and the first switch being coupled to each other and via a first inductor to the first output terminal, the second element and the second switch being coupled to each other and via a second inductor to the second output terminal, and the third element and the third switch being coupled to each other and via a third inductor to the third output terminal.

13. The driver arrangement as claimed in claim 12, further comprising a controller for controlling the switches and at least one element.

14. The driver arrangement as claimed in claim 13, each output terminal and its element and switch forming a stage, each stage being in one out of three modes defining a current passing this output terminal in dependence of said controlling.

15. The driver arrangement as claimed in claim 13, said controlling defining a duty cycle and/or a delay and/or a duration of a pulse signal to be supplied to a control electrode of one or more of said switches and element, and/or said controlling comprising synchronous switching.

16. The driver arrangement as claimed in claim 13, the controller comprising a setting circuit for setting a delay of a pulse signal to be supplied to a control electrode of one or more of said switches and element in response to a comparison of reference currents defined for the organic light emitting diode circuits.

17. A driver arrangement for driving first and second organic light emitting diode circuits, the driver arrangement comprising:
   a reference terminal,
   a power source terminal, and
   first and second output terminals,
   the first organic light emitting diode circuit comprising a first side to be coupled to the reference terminal and a second side to be coupled to the first output terminal,
   the second organic light emitting diode circuit comprising a first side to be coupled to the first output terminal and a second side to be coupled to the second output terminal, and
   the driver arrangement comprising:
   a first element coupled to the first output terminal and the reference terminal, and a first switch coupled to the power source terminal and the first output terminal, and
   a second element coupled to the second output terminal and the reference terminal, and a second switch coupled to the power source terminal and the second output terminal,
   wherein the first element and the first switch being coupled to each other and via a first inductor to the first output terminal, and the second element and the second switch being coupled to each other and via a second inductor to the second output terminal.

* * * * *